United States Patent [19]
Ikeda et al.

[11] Patent Number: 6,058,295
[45] Date of Patent: May 2, 2000

[54] TUNING CIRCUIT INCLUDING A PLURALITY OF CASCADE CONNECTED TUNING AMPLIFIER SECTIONS

[75] Inventors: Takeshi Ikeda, 5-6-213, San-no 2-chome, Ohta-ku, Tokyo 143; Tadataka Ohe, Saitama; Tsutomu Nakanishi, Tokyo, all of Japan

[73] Assignee: Takeshi Ikeda, Tokyo, Japan

[21] Appl. No.: 08/860,428

[22] PCT Filed: Jan. 11, 1996

[86] PCT No.: PCT/JP96/00027

§ 371 Date: Jun. 23, 1997

§ 102(e) Date: Jun. 23, 1997

[87] PCT Pub. No.: WO96/21969

PCT Pub. Date: Jul. 18, 1996

[30]    Foreign Application Priority Data

Jan. 12, 1995  [JP]  Japan ..................................... 7-021298

[51] Int. Cl.$^7$ ...................................................... H04B 1/18
[52] U.S. Cl. ............................................. 455/150.1; 331/2
[58] Field of Search ................................ 323/224; 331/2; 455/183.2, 180.4, 195.1, 192.1, 173.1; 327/113

[56]              References Cited

U.S. PATENT DOCUMENTS 3,882,397  5/1975  Konishi .
4,438,412  3/1984  Malinowski et al. ........................ 331/2
5,235,223  8/1993  Maple .

FOREIGN PATENT DOCUMENTS

| 0 413 348 | 2/1991 | European Pat. Off. . |
| 1 616 411 | 4/1971 | Germany . |
| 22 08 661 | 9/1973 | Germany . |
| 26 08 431 | 9/1977 | Germany . |
| 48-35745 | 9/1971 | Japan . |
| 62-152210 | 7/1987 | Japan . |
| 1-143514 | 6/1989 | Japan . |
| 5-183406 | 7/1993 | Japan . |

*Primary Examiner*—William Cumming
*Attorney, Agent, or Firm*—Dellett and Walters

[57]              ABSTRACT

A tuning circuit which has a wide tuning bandwidth. The tuning bandwidth or the tuning frequency can be easily changed. The tuning circuit 1 is imposed of two cascade-connected tuning amplifier sections 2 and 3. Each of the sections 2 and 3 is provided with cascade-connected phase-shifting circuits 10C and 30C, a non-inverting circuit 50, a voltage dividing circuit 160, and an adding circuit composed of a feedback resistor 70 and an input resistor 74. Prescribed tuning operation is performed by shifting the prescribed frequency 360° by means of the phase shifting circuits 10C and 30C and setting the open loop gain of a feedback loop at less than 1 when the output of the voltage dividing circuit 160 is feedback. The resistance ratio between the feedback resistor 70 and the input resistor 74 of each section 2, 3 is adjusted so that the maximum damping of each section 2, 3 may become smaller and the tuning bandwidth of each section 2, 3 becomes wider. Therefore, since the two tuning amplifier sections are cascade-connected, the maximum damping is increased and the tuning bandwidth is widened as a whole.

29 Claims, 23 Drawing Sheets

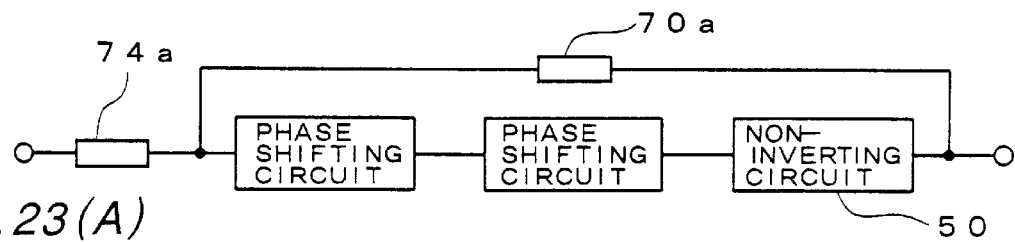
FIG.23(A)
FIG.23(B)
FIG.23(C)
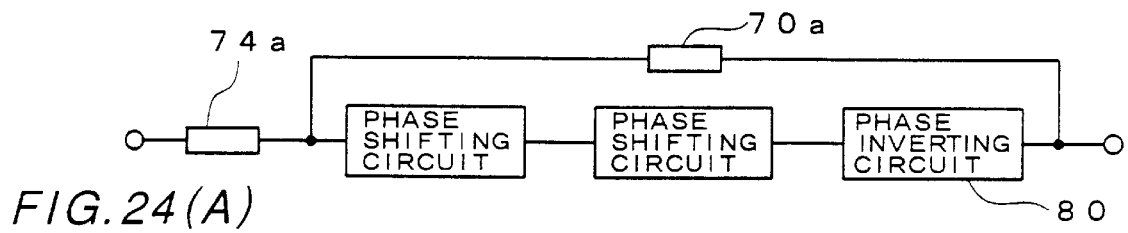
FIG.24(A)
FIG.24(B)
FIG.24(C)

TUNING CIRCUIT INCLUDING A PLURALITY OF CASCADE CONNECTED TUNING AMPLIFIER SECTIONS

TECHNICAL FIELD

The present invention relates to a tuning circuit easily adapted to an integrated circuit and capable of selectively providing as an output any desired frequency component in an input signal.

BACKGROUND OF ART

Generally, tuning circuits for receiving a video signal in a television receiver and the like require to have a relatively wide frequency bandwidth and thus use, for example, staggered tuning amplifiers. The staggered tuning amplifiers are a combination of plural stages of single tuning circuits, each adapted to choose a narrow frequency bandwidth signal, to provide a wide frequency bandwidth and a given amplification factor as a whole. Such amplifiers find wide applications not only in the above mentioned television receivers but also in intermediate frequency amplifiers for radar systems, etc.

A plurality of single tuning amplifiers constituting the above mentioned conventional staggered tuning amplifiers comprise a combination of resonance circuits, each including typically an inductor and a capacitor. By shifting the resonance frequencies by a given frequency from one another, a relatively flat, wide frequency bandwidth tuning characteristic may be obtained as a whole. Tuning frequencies in such staggered tuning amplifiers are determined by inductors and capacitors to be used as pairs. However, any attempt to obtain a wide frequency bandwidth by combining, for example, two stages of single tuning amplifiers with a certain frequency difference may result in a non-flat tuning characteristic with undesirable attenuation in the intermediate or center frequency range. This leads to a conclusion that the number of cascade connected, single tuning amplifier stages must be increased for wider frequency characteristic. In varying tuning frequencies of three or more stages of tuning amplifiers, the resonance frequency of each single tuning amplifier must be controlled in harmony with those in the other amplifiers, thereby making the control very complicated and subjecting to substantial change in characteristic when the tuning frequencies are varied. This is believed to be the reason why the tuning frequencies have never been varied in practical use. In a heterodyne system, for example, signal is processed after being converted into an intermediate frequency and thus the tuning frequency is maintained constant.

DISCLOSURE OF INVENTION

It is the object of the present invention to solve the above problems and to provide a tuning circuit having a wider tuning frequency bandwidth, capable of easily varying the tuning frequency bandwidth or the tuning frequency, and suitable to adapt to an integrated circuit.

The tuning circuit in accordance with the present invention comprises a plurality of cascade connected tuning amplifier sections of substantially equal tuning frequency, each tuning amplifier sections comprising:

an adding circuit for summing an input signal applied to one end of an input impedance element and a feedback signal applied to one end of a feedback impedance element;

a pair of phase shifting circuits for shifting the phase in opposite polarities to each other, each including converter means for converting an input AC signal into inverted and non-inverted output signals and combining means for combining one of the output AC signals from the converter means by way of a capacitor or an inductor and the other output AC signal by way of a resistor;

a non-inverting circuit for amplifying the input AC signal thereto by a predetermined amplification factor without altering its phase; and a voltage dividing circuit for dividing the input AC signal by a predetermined dividing ratio;

wherein the pair of phase shifting circuits, the non-inverting circuit and the voltage dividing circuit are connected in a cascade manner, the signal summed by the adding circuit is applied to the first stage of the cascade connected plurality of circuits, the output from the final stage circuit is applied to one end of the feedback impedance element as the feedback signal, and the input signal to the voltage dividing circuit is derived as the output signal.

The tuning circuit of the present invention comprises a plurality of cascade connected tuning amplifier sections of substantially equal tuning frequency, each of the tuning amplifier sections comprising:

an adding circuit for summing an input signal applied to one end of an input impedance element and a feedback signal applied to one end of a feedback impedance element;

a pair of phase shifting circuits for shifting the phase in opposite polarities to each other, each including converter means for converting an input AC signal into inverted and non-inverted output signals and combining means for combining one of the output AC signals from the converter means by way of a capacitor or an inductor and the other output AC signal by way of a resistor;

a phase inverting circuit for inverting the phase of the input AC signal thereto and amplifying the signal with a predetermined amplification factor; and a voltage dividing circuit for dividing the input AC signal thereto by a predetermined dividing ratio;

wherein the pair of phase shifting circuits, the phase inverting circuit and the voltage dividing circuit are connected in a cascade manner, the signal summed by the adding circuit is applied to the first stage of the cascade connected circuits, the output from the final stage circuit is applied to one end of the feedback impedance element as the feedback signal, and the input signal to the voltage dividing circuit is derived as the output signal.

The tuning circuits of the present invention comprises a plurality of cascade connected tuning amplifier sections of different tuning frequencies shifted each other by predetermined amount, each of the tuning amplifier sections comprising:

an adding circuit for summing an input signal applied to one end of an input impedance element and a feedback signal applied to one end of a feedback impedance element;

a pair of phase shifting circuits for shifting the phase in opposite polarities to each other, each including converter means for converting an input AC signal into inverted and non-inverted output signals and combining means for combining one of the output AC signals from the converter means by way of a capacitor or an inductor and the other output AC signal by way of a resistor;

a non-inverting circuit for amplifying the input AC signal by a predetermined amplification factor without altering its phase; and a voltage dividing circuit for dividing the input AC signal by a predetermined dividing ratio;

wherein the pair of phase shifting circuits, the non-inverting circuit and the voltage dividing circuit are connected in a cascade manner, the signal summed by the adding circuit is applied to the first stage of the cascade connected circuits, the output from the final stage circuit is applied to one end of the feedback impedance element as the feedback signal and the input signal to the voltage dividing circuit is derived as the output signal.

The tuning circuit of the present invention comprises a plurality of cascade connected tuning amplifier sections of different tuning frequencies shifted each other by predetermined amount, each tuning amplifier sections comprising:

an adding circuit for summing an input signal applied to one end of an input impedance element and a feedback signal applied to one end of a feedback impedance element;

a pair of phase shifting circuits for shifting the phase in opposite polarities to each other, each including converter means for converting an input AC signal into inverted and non-inverted output signals and combining means for combining one of the output AC signals from the converter means by way of a capacitor or an inductor and the other output AC signal by way of a resistor;

a phase inverting circuit for inverting the phase of the input AC signal thereto and amplifying the signal with a predetermined amplification factor; and a voltage dividing circuit for dividing the input AC signal thereto a predetermined dividing ratio;

wherein the pair of phase shifting circuits, the non-inverting circuit and the voltage dividing circuit are connected in a cascade manner, the signal summed by the adding circuit is applied to the first stage of the cascade connected circuits, the output from the final stage circuit is applied to one end of the feedback impedance element as the feedback signal, and the input signal to the voltage dividing circuit is derived as the output signal.

BRIEF DESCRIPTION OF DRAWINGS

FIGS. 23(A)–23(C) are a connection arrangements of the two phase shifting circuits and the non-inverting circuit included in the tuning amplifier section.

FIGS. 24(A)–24(C) are a connection arrangements of the two phase shifting circuits and the phase inverting circuit included in the tuning amplifier section.

BEST MODE FOR CARRYING OUT THE INVENTION

Figure 1:
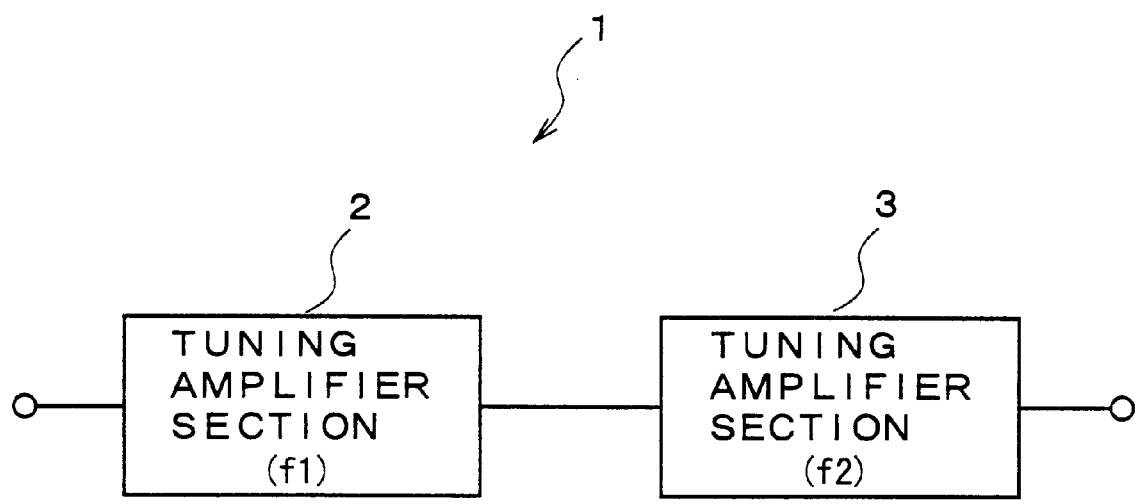
FIG. 1 is a block diagram of the tuning circuit to which the present invention is applied.

FIG. 1 is a block diagram to show the principle of one embodiment of the tuning circuit to which the present invention is applied. The tuning circuit 1 in FIG. 1 comprises a cascade connection of a first tuning amplifier section 2 and a second tuning amplifier section 3.

The tuning frequency of the first tuning amplifier section 2 is set to f1 for extracting or picking up only signal components of the input signal applied to the input terminal whose frequency is close to f1. While the second tuning amplifier section 3 is set to f2 in the tuning frequency for providing from the output terminal signal components from the first tuning amplifier section 2 having frequency close to f2. Note that the tuning frequencies f1, f2 of the first and second tuning amplifier sections 2, 3 are set substantially equal (including exactly equal) to each other.

Figure 2:
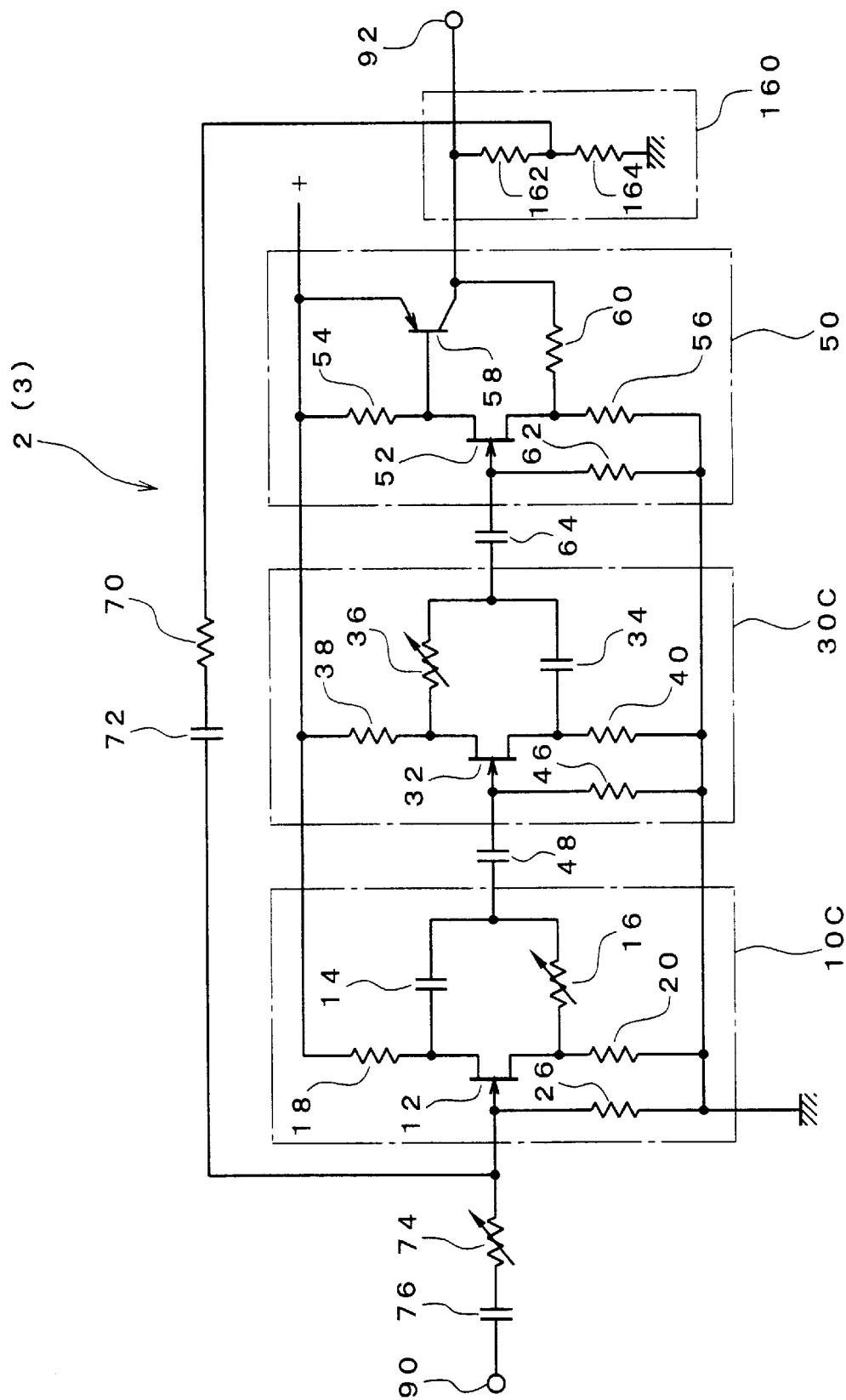
FIG. 2 is a circuit schematic of each tuning amplifier section in FIG. 1.

Illustrated in FIG. 2 is a circuit schematic of one tuning amplifier section 2 mentioned above. It is to be noted that the other tuning amplifier section 3 may have the same construction.

The tuning amplifier section 2 in FIG. 2 comprises a pair of phase shifting circuits 10C, 30C for providing 360° phase shift in total of respective input AC signals at a certain frequency, a non-inverting circuit 50 for amplifying the output signal from the phase shifting circuit 30C by a predetermined amplification factor without altering its phase, a voltage dividing circuit 160 disposed at the subsequent stage to the non-inverting circuit 50 and comprising resistors 162, 164, and an adding circuit for combining with a predetermined ratio the divided output (feedback signal) from the voltage dividing circuit 160 by way of a feedback resistor 70 and a signal applied to an input terminal 90 (input signal) by way of an input resistor 74. (The resistance of the input resistor 74 is equal to n times of that of the feedback resistor 70.)

Now, capacitor 72 connected in series with the feedback resistor 70 and capacitor 76 interposed between the input resistor 74 and the input terminal 90 are DC current blocking capacitors having a large capacitance so that their impedance is fairly low at the operating frequency.

Figure 3:
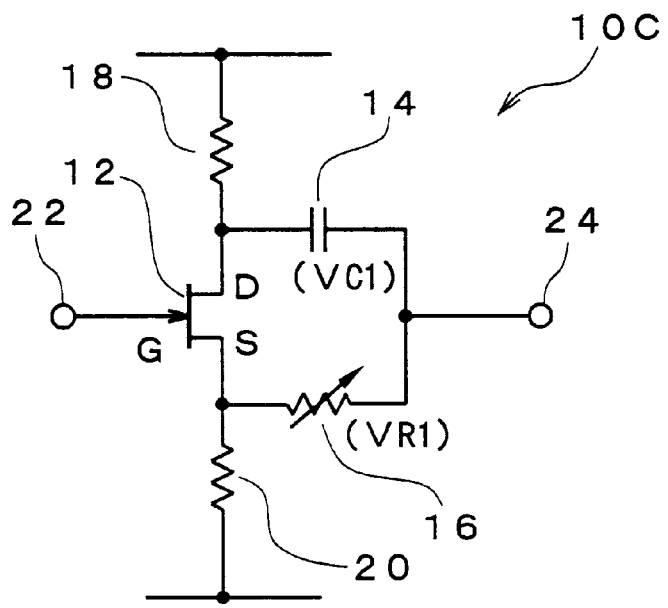
FIG. 3 is a circuit schematic of the phase shifting circuit at the first stage in FIG. 2.

Shown in FIG. 3 is a circuit schematic of only the front stage phase shifting circuit 10C in FIG. 2. The front stage phase shifting circuit 10C in FIG. 3 comprises a transistor 12 having its gate connected to an input terminal 22, a variable resistor 16 and a capacitor 14 connected in series between the source and drain of the transistor 12, a resistor 18 connected between the drain of the transistor 12 and a positive voltage source, and a resistor 20 connected between the source of the transistor 12 and ground.

It is assumed that the two resistors 20, 18 connected to the source and drain of the transistor 12 have equal resistance to each other. Now, considering AC components of the input voltage applied to the input terminal 22, it is understood that inverted (180° out of phase) and non-inverted (or in-phase) output signals are derived from the drain and source of the transistor 12, respectively.

A resistor 26 in the phase shifting circuit 10C in FIG. 2 is used to apply an appropriate bias voltage to the transistor 12.

When a predetermined AC signal is applied to the input terminal 22 of the phase shifting circuit 10C of the above construction, i.e., when an AC voltage (input voltage) is applied to the gate of the transistor 12, an AC voltage which is in-phase (non-inverted) with the input voltage appears on the source of the transistor 12. On the other hand, the voltage appearing on the drain of the transistor 12 is inverted (opposite phase) with respect to the input voltage and is equal in amplitude to the AC voltage appeared on the source. Let the amplitude of the AC voltages on the source and drain be Ei.

Connected between the source and drain of the transistor 12 is a series circuit (CR circuit) comprising the variable resistor 16 and the capacitor 14. Derived from the output terminal 24 is a combined signal of the source and drain voltages of the transistor 12 by way of the variable resistor 16 and the capacitor 14, respectively.

Figure 4:
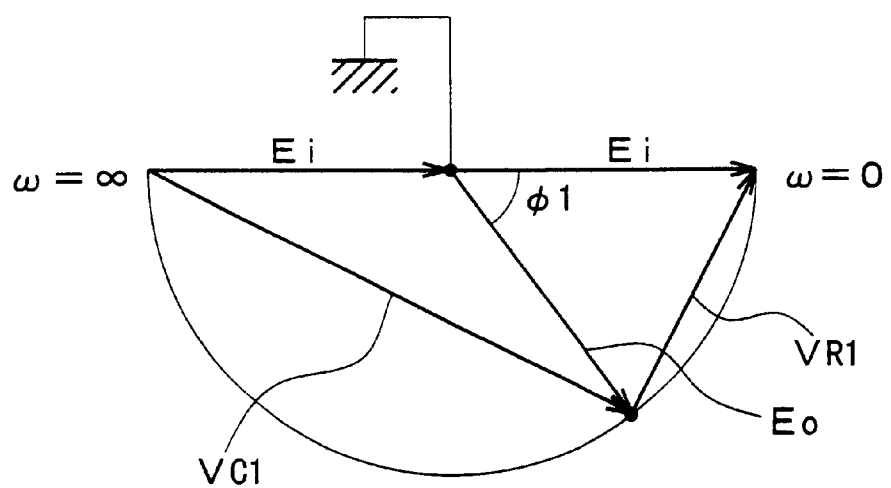
FIG. 4 is a vector diagram showing the relationship between the input and output voltages and the voltage across a capacitor and like in the phase shifting circuit as shown in FIG. 3.

Shown in FIG. 4 is a vector diagram representing the relationship between the input and output voltages and the voltages across the capacitor, etc. in the front stage phase shifting circuit 10C.

The source and drain voltages of the transistor 12 are respectively non-inverted and inverted with respect to the input voltage and AC voltage of the amplitude equal to Ei, thereby providing the potential difference (AC component) between the source and drain equal to 2Ei. Voltages VC1 and VR1 developing respectively across the capacitor 14 and the variable resistor 16 are 90° out of phase. Vector combination of these voltages VC1 and VR1 is equal to 2Ei, the voltage between the source and drain of the transistor 12.

As a result, a right angle triangle is formed as shown in FIG. 4 with twice of the voltage Ei as its hypotenuse and the voltages VC1 and VR1 across the capacitor 14 and the variable resistor 16 as two perpendicular sides. When the input signal is constant in amplitude and varies in frequency, the voltages VC1 and VR1 across the capacitor 14 and the variable resistor 16 vary along the semi-circle as shown in FIG. 4.

It is to be noted that the potential difference between the junction point of the capacitor 14 and the variable resistor 16 and ground level is derived as the output voltage Eo which is represented by the vector starting at the center of the semi-circle in FIG. 4 and ending at the crosspoint of the voltages VC1 and VR1 on the semi-circle. Its amplitude is equal to the radius Ei of the semi-circle. Since the ending point of the vector moves on the semi-circle regardless of any change of the input signal frequency, it is possible to obtain a stabilized output having a constant output amplitude regardless of the frequency.

As apparent from FIG. 4, since the voltages VC1 and VR1 cross at right angle on the semi-circle, the phase difference of the input voltage applied to the gate of the transistor 12 and the voltage VC1 varies theoretically from 0° to 90° as the frequency ω varies from 0 to ∞. Since the phase shift φ1 of the overall phase shifting circuit 10C is equal to twice of the above phase difference and thus varies from 0° to 180° depending on the frequency.

Figure 5:
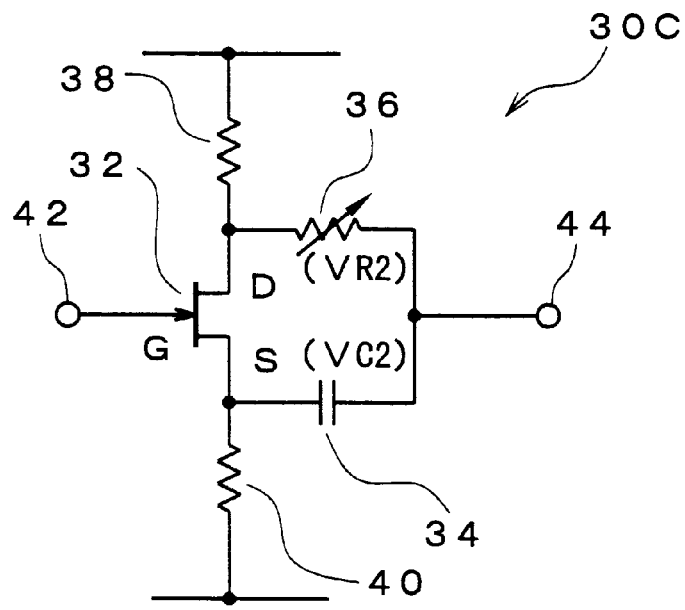
FIG. 5 is a circuit schematic of the subsequent stage phase shifting circuit in FIG. 2.

Similarly, shown in FIG. 5 is a circuit schematic of the subsequent stage phase shifting circuit 30C as shown in FIG. 2. The subsequent stage phase shifting circuit 30C in FIG. 5 comprises a transistor 32 having the gate connected to the input terminal 42, a capacitor 34 and a variable resistor 36 connected in series between the source and drain of the transistor 32, a resistor 38 connected between the drain of the transistor 32 and a positive voltage source, and a resistor 40 connected between the source of the transistor 32 and ground.

Similar to the phase shifting circuit 10C, two resistors 40, 38 connected to the source and drain of the transistor 32 in FIG. 5 are set to equal to each other. Considering the AC component of the input voltage applied to the input terminal 42, derived from the source and drain of the transistor 32 are in-phase (non-inverted) and inverted output signals.

A resistor 46 in the phase shifting circuit 30C in FIG. 2 is used to apply appropriate bias voltage to the transistor 32. A capacitor 48 interposed between the phase shifting circuits 30C, 10C is a DC blocking capacitor for removing the DC component in the output from the phase shifting circuit 10C thereby applying only AC component to the phase shifting circuit 30C.

When a predetermined AC signal is applied to the input terminal 42 of the phase shifting circuit 30C of the above construction, i.e., when an AC voltage (input voltage) is applied to the gate of the transistor 32, an AC voltage which is in-phase with the input voltage appears on the source of the transistor 32. On the other hand, the voltage appearing on the drain of the transistor 32 is inverted with respect to the input voltage and is equal in amplitude to the AC voltage appeared on the source. Let the amplitude of AC voltages on the source and drain be Ei.

Connected between the source and drain of the transistor 32 is a series circuit (CR circuit) comprising the capacitor 34 and the variable resistor 36. Derived from the output terminal 44 is a combined signal of the source and drain voltages of the transistor 32 by way of the capacitor 34 and the variable resistor 36, respectively.

Figure 6:
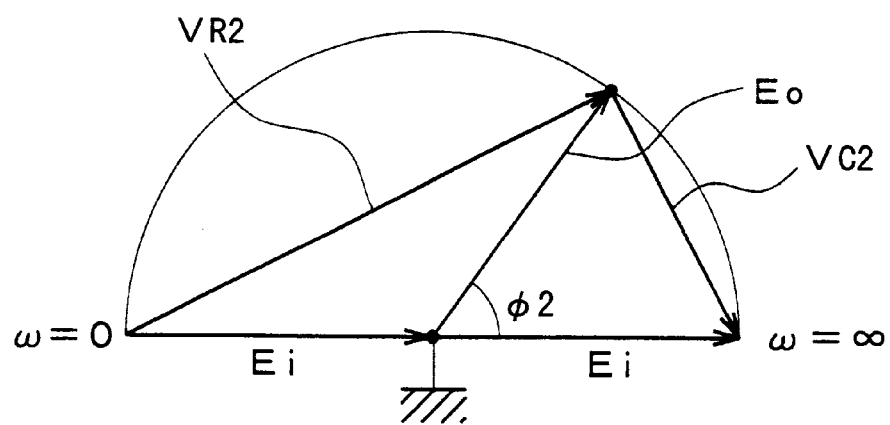
FIG. 6 is a vector diagram showing the relationship between the input and output voltages and the voltage across the capacitor and the like in the phase shifting circuit as shown in FIG. 5.

Shown in FIG. 6 is a vector diagram representing the relationship between the input and output voltages and the voltages across the capacitor, etc. in the subsequent stage phase shifting circuit 30C.

The source and drain voltages of the transistor 32 are respectively non-inverted and inverted with respect to the input voltage and AC voltage of the amplitude equal to Ei, thereby providing the potential difference between the source and drain equal to 2Ei. Voltages VR2 and VC2 developing respectively across the variable resistor 36 and the capacitor 34 are 90° out of phase. Vector combination of these voltages VR2 and VC2 is equal to 2Ei, the voltage between the source and drain of the transistor 32.

As a result, a right angle triangle is formed as shown in FIG. 6 with twice of the voltage Ei as its hypotenuse and the voltages VR2 and VC2 across the variable resistor 36 and the capacitor 34 as two perpendicular sides. When the input signal is constant in amplitude and varies in frequency, the voltages VR2 and VC2 across the variable resistor 36 and the capacitor 34 vary along the semi-circle as shown in FIG. 6.

It is to be noted that the potential difference between the junction point of the variable resistor 36 and the capacitor 34 and ground level is derived as the output voltage Eo which is represented by the vector starting at the center of the semi-circle in FIG. 6 and ending at the crosspoint of the voltages VR2 and VC2 on the semi-circle. Its amplitude is equal to the radius Ei of the semi-circle. Since the ending point of the vector moves on the semi-circle regardless of any change of the input signal frequency, it is possible to obtain a stabilized output having a constant output amplitude regardless of the frequency.

As apparent from FIG. 6, since the voltages VR2 and VC2 cross at right angle on the semi-circle, the phase difference of the input voltage applied to the gate of the transistor 32 and the voltage VR2 varies theoretically from 90° to 0° as the frequency ω varies from 0 to ∞. Since the phase shift φ2 of the overall phase shifting circuit 30C is equal to twice of the above phase difference and thus varies from 180° to 0° depending on the frequency.

In this manner, the two phase shifting circuits 10C, 30C provide the predetermined phase shift. Also, the relative phase relationship between the input and output voltages of each of the phase shifting circuits 10C, 30C is opposite to each other as shown in FIGS. 4 and 6, thereby providing the signal at predetermined frequency at which the overall phase shift is 360°.

The non-inverting circuit 50 as shown in FIG. 2 comprises a transistor 52 having the drain connected to a positive voltage source through a resistor 54 and the source connected to ground through a resistor 56, a transistor 58 having the base connected to the drain of the transistor 52 and the collector connected to the source of the transistor 52 through a resistor 60, and a resistor 62 for applying appropriate bias voltage to the transistor 52. Note that the capacitor 64 disposed at the front stage of the non-inverting circuit 50 as shown in FIG. 2 is a DC blocking capacitor for eliminating DC components from the output of the subsequent stage phase shifting circuit 30C while applying AC components to the non-inverting circuit 50.

When an AC signal is applied to the gate, the transistor 52 develops an inverted signal on the drain. On the other hand, when the inverted signal is applied to the base, the transistor 58 provides from the collector thereof an inverted signal which is in phase with respect to the signal on the gate of the transistor 52. It is the in-phase (non-inverted) signal derived from the output of the non-inverting circuit 50.

The output from the non-inverting circuit 50 is derived from the output terminal 92 as the output of the tuning amplifier section 2 and is fed back to the input side of the front stage phase shifting circuit 10C by way of the voltage dividing circuit 160 and the feedback resistor 70. The feedback signal is added to the input signal through the input resistor 74 so that the added or summed voltage is applied to the input terminal (the input terminal 22 in FIG. 3) of the front stage phase shifting circuit 10C.

The amplification factor (gain) of the above mentioned non-inverting circuit 50 is determined by the resistance of the resistors 54, 56, 60. By adjusting the resistor of each of these resistors, the open loop gain of the feedback loop comprising the pair of phase shifting circuits 10C, 30C, the voltage dividing circuit 160 and the feedback resistor 70 in FIG. 2 may be set to less than 1. This means that the signal attenuation through the pair of phase shifting circuits 10C, 30C and the voltage dividing circuit 160 can be compensated by the gain of the non-inverting circuit 50, thereby the open loop gain of the feedback loop of the entire tuning amplifier is set to 1 or less.

Also derived from the output terminal 92 of the tuning amplifier section 2 is the output signal of the non-inverting circuit 50 to be applied to the voltage dividing circuit 160. The tuning amplifier section 2 can have a gain to amplify the signal amplitude simultaneously with the tuning operation.

Let the time constant of the CR circuit of each of the phase shifting circuits 10C, 30C be $T_1$, $T_2$, the phase angles φ1, φ2 as shown in FIGS. 4 and 6 can be calculated as follows:

$$\phi1 = \tan^{-1}\{2\omega T_1/(1-\omega^2 T_1^2)\} \quad (1)$$

$$\phi2 = -\tan^{-1}\{2107\, T_2/(1-\omega^2 T_2^2)\} \quad (2)$$

It is to be noted, here, that φ2 in FIG. 6 has "−" sign with respect to φ1 as shown in FIG. 4.

In case of, for example, $T_1=T_2(=T)$, the total phase shift of the two phase shifting circuits 10C, 30C is equal to 360° to achieve the aforementioned tuning operation when ω=1/T. At this point, φ1=90° and φ2=−90°.

Although the phase of the output voltage Eo is shown to lead the input voltage Ei in the subsequent stage phase shifting circuit 30C in FIG. 6, it is to be noted that the output signal is in fact lagging with respect to the input signal.

Figure 7A:
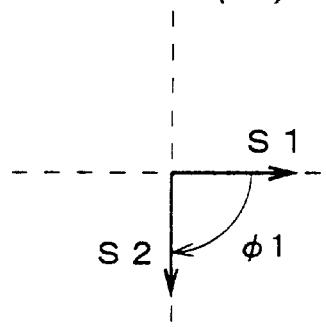
FIGS. 7(A)–7(C) show the phase relationship between the input and output signals of the two phase shifting circuits included in the tuning amplifier section.
Figure 7B:
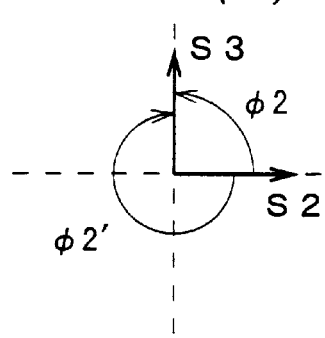
Figure 7C:
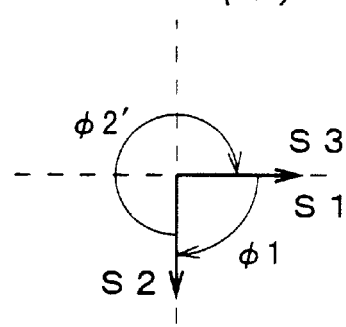

Illustrated in FIGS. 7(A)–7(C) are phase relationships between input and output signals to the two phase shifting circuits 10C, 30C. In the shown example, applied to the front stage phase shifting circuit 10C is the input signal having the frequency equal to the tuning frequency and the time constants $T_1$, $T_2$ of the phase shifting circuits 10C, 30C are equal to each other.

As shown in FIG. 7(A), the front stage phase shifting circuit 10C provides the output signal S2 with phase shift of the φ1 (=90°) with respect to the input signal S1.

In the subsequent stage phase shifting circuit 30C as shown in FIG. 7(B), the output signal S3 is shifted by φ2 with respect to the input signal S2 (equal to the output signal from the front stage phase shifting circuit 10C). The output signal S3 appears to lead the input signal S2 by 90° but is in fact inverted and lagged by 90°, thereby lagging φ2'=270°.

As a result, in case of cascade connection of the two phase shifting circuits 10C, 30C as shown in FIG. 7(C), the overall phase shift will be 360° by summing the aforementioned φ1=90° and φ'2=270°.

Figure 8:
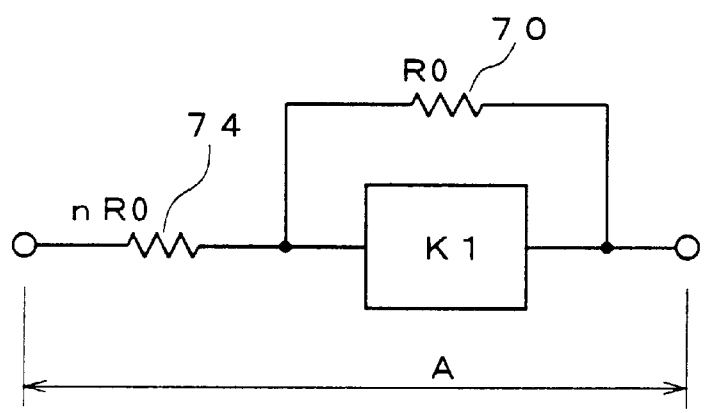
FIG. 8 is a circuit schematic of the two phase shifting circuits, a non-inverting circuit and a voltage dividing circuit included in the tuning amplifier section replaced by a circuit having a certain transfer function.
Figure 9:
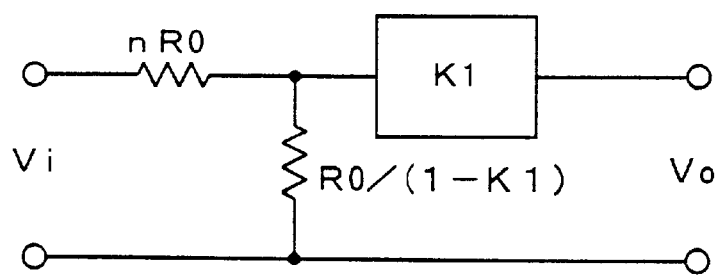
FIG. 9 is a circuit schematic in FIG. 8 converted by the Miller's principle.

Illustrated in FIG. 8 is a system diagram of the above mentioned two phase shifting circuits 10C, 30C, non-inverting circuit 50 and the voltage dividing circuit 60 replaced by the transfer function K1. A circuit having the transfer function K1 is paralleled with the feedback resistor 70 having a resistance R0 and connected to the input resistor 74 having a resistance equal to n times of R0 (=nR0). Also illustrated in FIG. 9 is a system diagram of the system in FIG. 8 converted by using the Miller's principle. The overall transfer function A of the converted system is given by the following expression (3):

$$A = Vo/Vi = K1/\{n(1-K1)+1\} \quad (3)$$

The transfer function K2 of the front stage phase shifting circuit 10C is given by the following expression (4):

$$K2 = a_1(1-T_1 s)/(1+T_1 s) \quad (4)$$

Where, $T_1$ is the time constant of the CR circuit defined by the variable resistor 16 and the capacitor 14 (let the resistance of the variable resistor 16 be R and the capacitance of the capacitor 14 be C, $T_1=CR$), $s=j\omega$ and $a_1$ is the gain of the phase shifting circuit 10C, thereby 1 or less.

Also, the transfer function K3 of the subsequent stage phase shifting circuit 30C is given by the following expression (5):

$$K3 = -a_2(1-T_2 s)/(1+T_2 s) \quad (5)$$

Where, $T_2$ is the time constant of the CR circuit comprising the capacitor 34 and the variable resistor 36 (let the capacitance of the capacitor 34 be C and the resistance of the variable resistor 36 be R, $T_2=CR$), and $a_2$ is the gain of the phase shifting circuit 30C, thereby 1 or less.

Now, it is assumed that the gain of the voltage dividing circuit 160 is $a_3 (\leq 1)$ and the gain of the non-inverting circuit 50 is set to $1/(a_1 a_2 a_3)$ in order to compensate for signal attenuation by the phase shifting circuits 10C, 30C and the voltage dividing circuit 160, overall transfer function K1 of the cascade connection of the phase shifting circuits 10C, 30C, the non-inverting circuit 50 and the voltage dividing circuit 160 is given by the following expression (6):

$$K1 = -\{1+(Ts)^2 - 2Ts\}/\{1+(Ts)^2 + 2Ts\} \quad (6)$$

Note that both time constants $T_1$ and $T_2$ of the phase shifting circuits are considered to be equal to T in the above expression (6) for simplicity. A combination of the above expressions (6) and (3) leads to the following expression (7):

$$\begin{aligned}A &= -\{1+(Ts)^2 - 2Ts\}/[(2n+1)\{1+(Ts)^2\} + 2Ts] \quad (7)\\ &= -\{1/(2n+1)\}[\{1+(Ts)^2 - 2Ts\}/\\ &\quad \{1+(Ts)^2 + 2Ts/(2n+1)\}]\end{aligned}$$

According to the expression (7), the maximum attenuation $A = -1/(2n+1)$ is achieved at $\omega=0$ (DC domain). Also, $A=-1/(2n+1)$ at $\omega=\infty$. At the tuning point of $\omega=1/T$ (if the time constants of the phase shifting circuits differ, the tuning point $\omega=1/\sqrt{(T_1 \cdot T_2)}$), A=1 independent of the resistance ratio n of the feedback resistor 70 and the input resistor 74. In other words, the tuning point and the attenuation at the tuning point remain unchanged as the resistance ratio n is varied as shown in FIG. 10.

Since the tuning circuit 1 as shown in FIG. 1 comprises the aforementioned two tuning amplifier sections 2, 3 connected in a cascade manner, the tuning frequencies of the two tuning amplifier sections can be set to equal to each other or can be shifted by a certain frequency.

Figure 11:
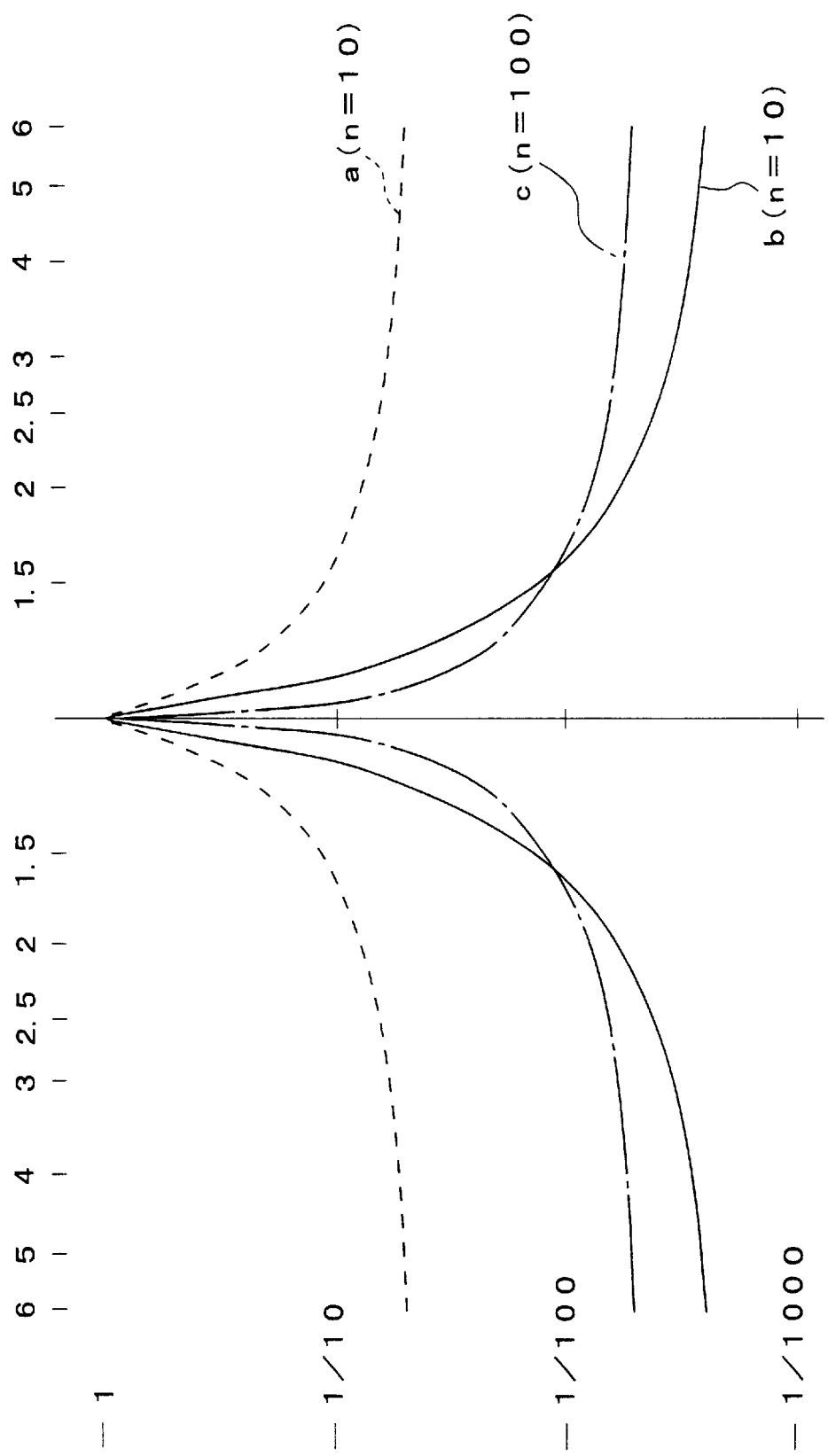
FIG. 11 is an overall characteristic chart of the tuning circuit comprising two tuning amplifier sections of identical tuning frequency to each other.

Illustrated in FIG. 11 are characteristic curves of the tuning circuit 1 including two cascade connected tuning amplifier sections set to equal tuning frequency. The characteristic curve a (dotted line) is for the first or second tuning amplifier section 2, 3 with the resistance ratio n equal to "10". The characteristic curve b (solid line) is for the overall tuning circuit 1 of the present embodiment including the cascade connected tuning amplifier sections 2, 3. For reference, represented by the characteristic curve c (single chain line) is a tuning characteristic of a single tuning amplifier section 2 (or 3) to have substantially similar maximum attenuation as the tuning circuit 1 according to the present embodiment. Apparently, the tuning frequency bandwidth is narrower than that of the tuning circuit 1 according to the present embodiment.

Figure 10:
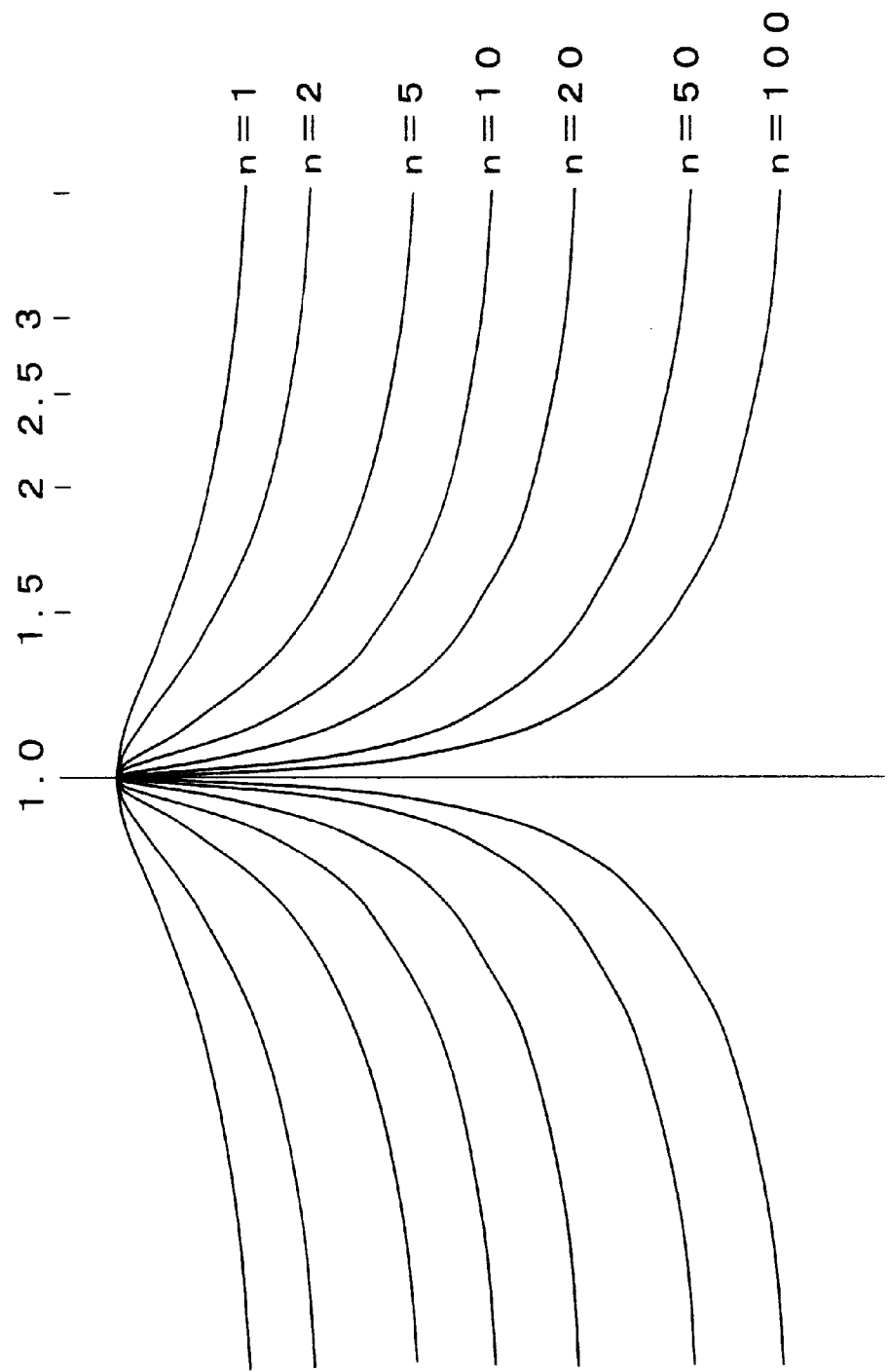
FIG. 10 is a characteristic chart of the tuning amplifier section.

As apparent from comparison between FIGS. 10 and 11, a cascade connection of two tuning amplifier sections 2, 3 with relatively small resistance ratio n between the feedback resistor 70 and the input resistor 74 to provide lower maximum attenuation will provide larger maximum attenuation and wider tuning frequency bandwidth as a whole.

Particularly, according to the tuning characteristic in FIG. 11, the tuning frequency bandwidth with the maximum attenuation of each tuning amplifier section 2, 3 set to about ½ is considerably wider than twice. Accordingly, in the present embodiment including two tuning amplifier sections with their maximum attenuation set to about ½, it is possible to obtain a tuning circuit 1 having wider frequency bandwidth while maintaining the maximum attenuation unchanged. It is to be noted here that the maximum attenuation of each tuning amplifier section can be set to about ½ equally or different resistance ratio n may be set to provide different attenuations so that the overall attenuation will be the intended value.

Although two tuning amplifier sections 2, 3 are cascade connected in the aforementioned tuning circuit 1, more than two tuning amplifier sections of substantially equal tuning frequency can be connected in a cascade manner. In such example, the maximum attenuation of each tuning amplifier section can be lower and the tuning frequency bandwidth can be broader to obtain an overall tuning circuit having wider tuning frequency bandwidth by combining these characteristic curves.

Although the tuning frequency of the two tuning amplifier sections 2, 3 are equalized in FIG. 11, tuning frequencies of the tuning amplifier sections 2, 3 may be shifted each other by a given frequency. In such example cascade connection of two relatively low maximum attenuation, wider tuning frequency bandwidth tuning amplifier sections 2, 3 helps to provide a targeted maximum attenuation and wider tuning frequency bandwidth as a whole. In particular, unlike conventional staggered tuning amplifier circuit, each tuning amplifier section 2, 3 has a wider tuning frequency bandwidth, thereby enabling to minimize the number of cascade connected tuning amplifier sections.

Figure 12:
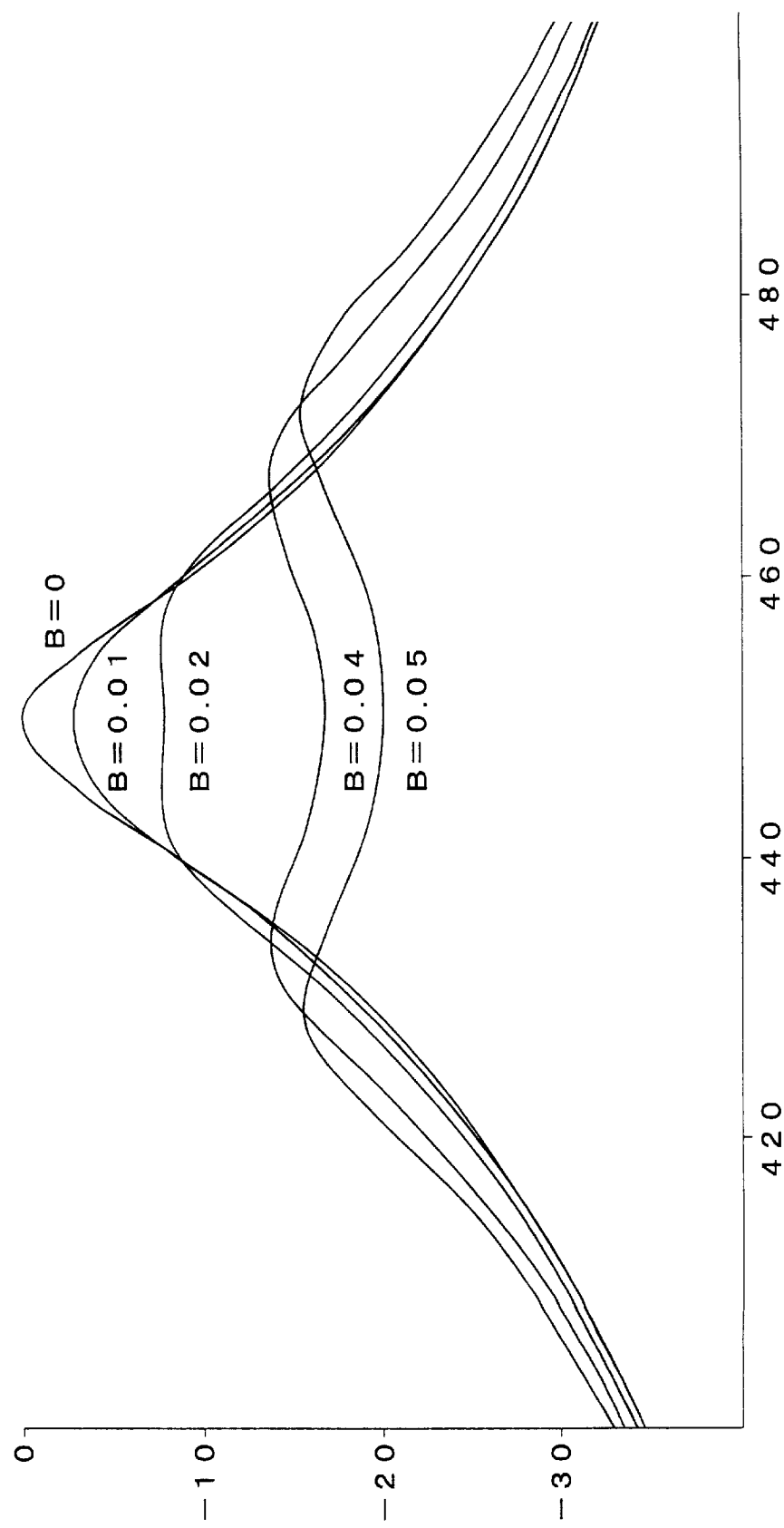
FIG. 12 is a characteristic chart of the tuning circuit comprising two tuning amplifier sections of different tuning frequencies.

Now, illustrated in FIG. 12 are characteristic curves of the tuning circuit 1 comprising two cascade connected tuning amplifier sections having shifted tuning frequencies from each other. In one example, the tuning frequency of the tuning amplifier section 2 is shifted slightly lower than the center frequency of 450 kHz while that of the tuning amplifier section 3 is shifted slightly higher than 450 kHz. In FIG. 12, represented by the vertical axis is attenuation (dB) and the horizontal axis is input signal frequency. Also represented by B is the difference from the center frequency (450 kHz). For example, B=0 means that the tuning frequencies of the two tuning amplifier sections 2, 3 are equal to the center frequency while B=0.02 means that the tuning frequency of the tuning amplifier section 2 is 2% lower than 450 kHz and that of the tuning amplifier section 3 is 2% higher than 450 kHz.

As apparent from FIG. 12, the attenuation characteristic curve near the tuning point is generally flat when the tuning frequencies of the two tuning amplifier sections 2,3 are shifted by predetermined amount. Also, the frequency bandwidth can be set to desired value by adjusting the amount of shift, thereby increasing or decreasing the flat area. It is to be noted, however, that shifting the tuning frequencies of the two tuning amplifier sections 2, 3 causes attenuation near the tuning frequency, thereby attenuating the signal amplitude. In such a case, an amplifier may be connected at the subsequent stage to the tuning circuit 1 in order to compensate for the attenuated signal amplitude.

Figure 13:
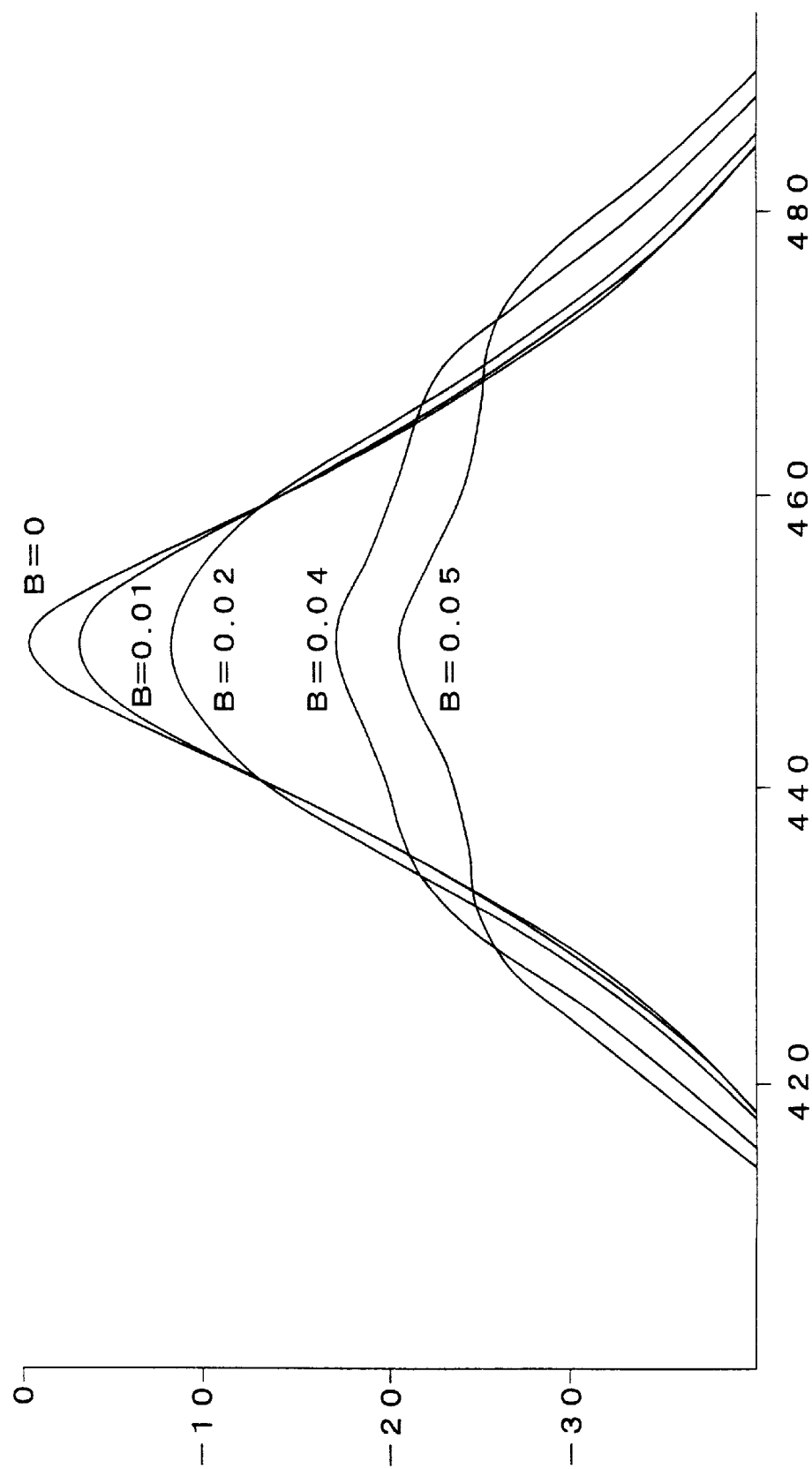
FIG. 13 is a characteristic chart of the tuning circuit comprising three tuning amplifier sections of different tuning frequencies from one another.

Illustrated in FIG. 13 are characteristic curves of the tuning circuit having three cascade connected tuning amplifier sections. In one example, the tuning frequency of the third stage tuning amplifier section is set to 450 kHz, that of the first stage tuning amplifier section is set to slightly lower than 450 kHz, and that of the second stage tuning amplifier section is set to slightly higher than 450 kHz.

As apparent from FIG. 12, in case of the tuning circuit comprising two cascade connected tuning amplifier sections, there is an increasing amount of attenuation near the center frequency as the tuning frequency difference of the two tuning amplifier sections increases. On the contrary, in a tuning amplifier section comprising three cascade connected tuning amplifier sections as shown FIG. 13, there causes less attenuation near the center frequency. It is therefore advantageous to cascade connect three or more tuning amplifier sections in order to secure a wider frequency bandwidth.

As understood from the foregoing description, the frequency bandwidth can be set wider by cascade connecting two or more tuning amplifier sections with their tuning frequencies identical to or shifted from each other, thereby enabling to apply to television tuners, etc. It is to be noted that a trap circuit may be incorporated with the tuning circuit 1, if necessary, in order to apply it to television tuners, etc.

Since the tuning frequency can be easily adjusted by controlling the resistance of the variable resistors 16, 36 in the phase shifting circuits 10C, 30C of two (or more) tuning amplifier sections 2, 3 constituting the tuning circuit 1, it is easy to achieve a variable frequency tuning circuit 1.

It is also noted that the tuning amplifier sections 2, 3 constituting the tuning circuit 1 can be constructed by a combination of transistors, capacitors and resistors which can be fabricated on a semiconductor substrate. This suggests that the entire circuit of the tuning circuit 1 can be easily fabricated on a semiconductor substrate as an integrated circuit.

Although two or more tuning amplifier sections are directly connected without any intervening element in the present embodiment, it is appreciated that a buffer circuit may be interposed between adjacent tuning amplifier sections in order to prevent interference. Alternatively, an amplifier may be interposed between adjacent tuning amplifier sections. Interposing such amplifier may help to make the characteristic curves, for example, in FIG. 13 more flat near the tuning point.

Although the tuning amplifier section 2(or 3) in FIG. 2 includes CR circuits in the phase shifting circuits 10C, 30C, such CR circuits may be replaced by LR circuits each comprising a resistor and an inductor.

Figure 14:
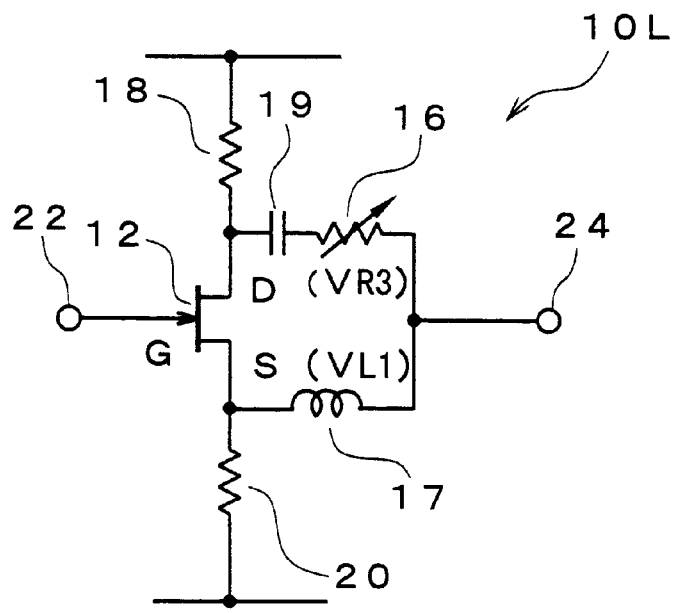
FIG. 14 is a circuit schematic of a phase shifting circuit to be replaced for the phase shifting circuit in FIG. 3.

Illustrated in FIG. 14 is a circuit schematic of a phase shifting circuit including an LR circuit, which can be replaced for the front stage phase shifting circuit 10C in the tuning amplifier section 2 as shown in FIG. 2. The phase shifting circuit 10L as shown in FIG. 14 is derived from the phase shifting circuit 10C in FIG. 3 by replacing the CR circuit of the capacitor 14 and the variable resistor 16 by the LR circuit of a variable resistor 16 and an inductor 17. It is to be noted that the capacitor 19 interposed between the drain of the transistor 12 and the variable resistor 16 is for DC current blocking and has sufficiently large capacitance to exhibit low impedance at the operating frequency.

Figure 15:
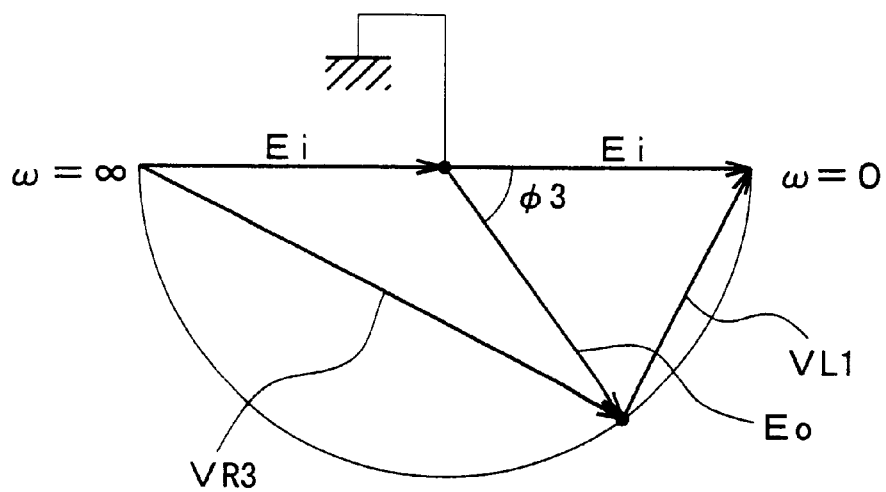
FIG. 15 is a vector diagram showing the relationship between the input and output voltages and the voltage across the inductor and the like in the phase shifting circuit in FIG. 14.

Shown in FIG. 15 is a vector diagram showing the relationship between the input and output voltages and the voltages across the inductor, etc. in the phase shifting circuit 10L.

Voltages VR3 and VL1 developing respectively across the variable resistor 16 and the inductor 17 are 90° out of phase. Vector combination of these voltages VR3 and VL1 is equal to 2Ei, the voltage between the source and drain of the transistor 12. As a result, a right angle triangle is formed as shown in FIG. 15 with twice of the voltage Ei as its hypotenuse and the voltages VR3 and VL1 across the variable resistor 16 and the inductor 17 as two perpendicular sides. When the input signal is constant in amplitude and varies in frequency, the voltages VR3 and VL1 across the variable resistor 16 and the inductor 17 vary along the semi-circle as shown in FIG. 15.

It is to be noted that the potential difference between the junction point of the variable resistor 16 and the inductor 17 and ground level is derived as the output voltage Eo which is represented by the vector starting at the center of the semi-circle in FIG. 15 and ending at the crosspoint of the voltages VR3 and VL1 on the semi-circle. Its amplitude is equal to the radius Ei of the semi-circle. Since the ending point of the vector moves on the semi-circle regardless of any change of the input signal frequency, it is possible to obtain a stabilized output having a constant output amplitude regardless of the frequency.

As apparent from FIG. 15, since the voltages VR3 and VL1 cross at right angle on the semi-circle, the phase difference of the input voltage applied to the gate of the transistor 12 and the voltage VR3 varies theoretically from 0° to 90° as the frequency ω varies from 0 to ∞. Since the phase shift φ3 of the overall phase shifting circuit 10L is equal to twice of the above phase difference and thus varies from 0° to 180° depending on the frequency.

Let the time constant of the LR circuit comprising the variable resistor 16 and the inductor 17 be $T_1(=L/R$, where R and L represent resistance and inductance of the variable resistor 16 and the inductor 17, respectively), then the phase shift φ3 is equal to the φ1 given by the above expression (1).

Figure 16:
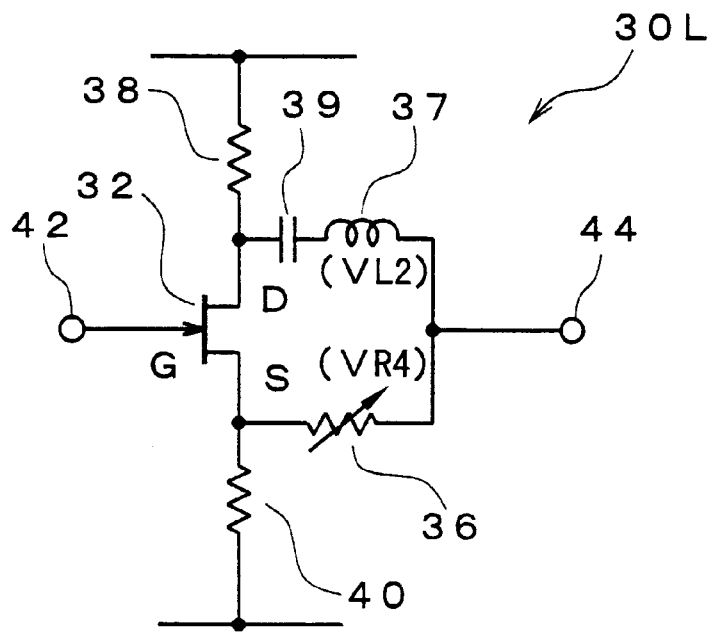
FIG. 16 is a circuit schematic of a phase shifting circuit capable of replacing the phase shifting circuit in FIG. 5.

Now, illustrated in FIG. 16 is a circuit schematic of another example of a phase shifting circuit including an LR circuit, which can be replaced for the subsequent stage phase shifting circuit 30C in the tuning amplifier section 2 in FIG. 2. The phase shifting circuit 30L in FIG. 16 is equal to the phase shifting circuit 30C in FIG. 5 if the CR circuit of the variable resistor 36 and the capacitor 34 is replaced by an LR circuit comprising the inductor 37 and the variable resistor 36. It is to be noted that the capacitor 39 interposed between the drain of the transistor 32 and the inductor 37 is for DC current blocking and has sufficiently large capacitance to exhibit low impedance at the operating frequency.

Figure 17:
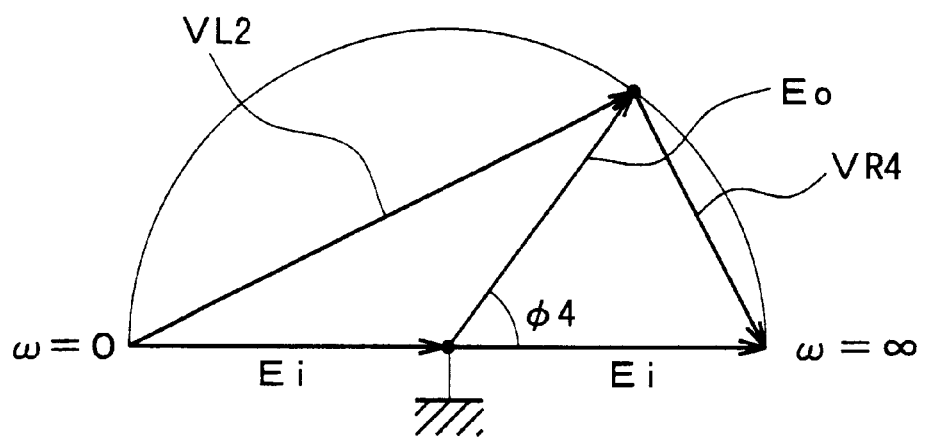
FIG. 17 is a vector diagram showing the relationship between the input and output voltages and the voltage across the inductor and the like in the phase shifting circuit as shown in FIG. 16.

Shown in FIG. 17 is a vector diagram showing the relationship between the input and output voltages and the voltages across the inductor, etc. in the phase shifting circuit 30L.

Voltages VL2 and VR4 developing respectively across the inductor 37 and the variable resistor 36 are 90° out of phase. Vector combination of these voltages VL2 and VR4 is equal to 2Ei, the voltage between the source and drain of the transistor 32. As a result, a right angle triangle is formed as shown in FIG. 17 with twice of the voltage Ei as its hypotenuse and the voltages VL2 and VR4 across the inductor 37 and the variable resistor 36 as two perpendicular sides. When the input signal is constant in amplitude and varies in frequency, the voltages VL2 and VR4 across the inductor 37 and the variable resistor 36 vary along the semi-circle as shown in FIG. 17.

It is to be noted that the potential difference between the junction point of the inductor 37 and the variable resistor 36 and ground level is derived as the output voltage Eo which is represented by the vector starting at the center of the semi-circle in FIG. 17 and ending at the crosspoint of the voltages VL2 and VR4 on the semi-circle. Its amplitude is equal to the radius Ei of the semi-circle. Since the ending point of the vector moves on the semi-circle regardless of any change of the input signal frequency, it is possible to obtain a stabilized output having a constant output amplitude regardless of the frequency.

Figure 19:
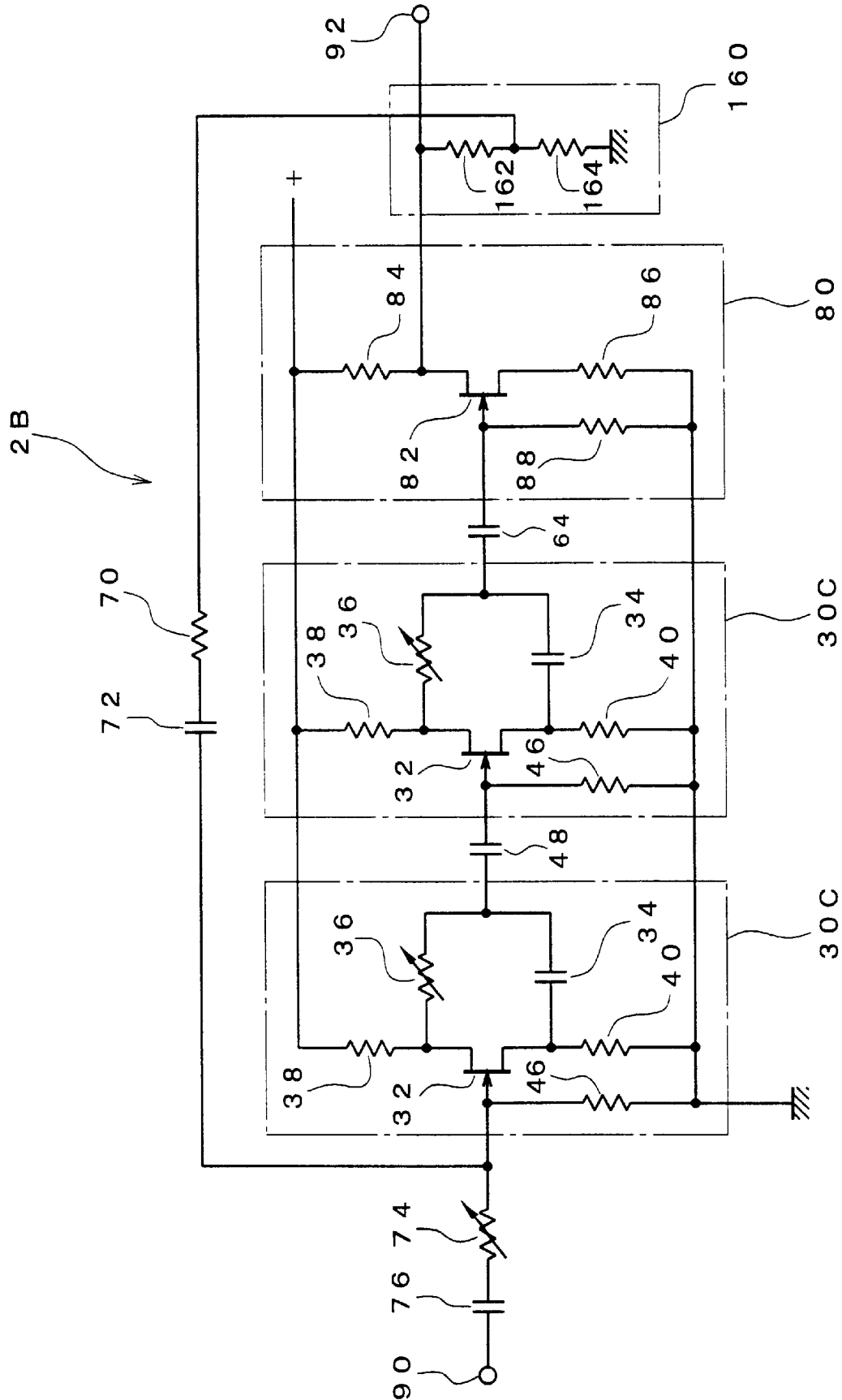
FIG. 19 is a circuit schematic of still another tuning amplifier section.

As apparent from FIG. 19, since the voltages VL2 and VR4 cross at right angle on the semi-circle, the phase difference of the input voltage applied to the gate of the transistor 32 and the voltage VL2 varies theoretically from 90° to 0° as the frequency ω varies from 0 to ∞. Since the phase shift φ4 of the overall phase shifting circuit 30L is equal to twice of the above phase difference and thus varies from 180° to 0° depending on the frequency.

Let the time constant of the LR circuit comprising the inductor 37 and the variable resistor 36 be $T_2(=L/R)$, where L and R represent inductance and resistance of the inductor 37 and the variable resistor 36, respectively), then the phase shift φ4 is equal to the φ2 given by the above expression (2).

As understood from the foregoing description, the phase shifting circuits 10L and 30L as shown in FIGS. 14 and 16 are equivalent to the phase shifting circuits 10C and 30C as shown in FIGS. 3 and 5, respectively. It is therefore possible to replace the front stage phase shifting circuit 10C and the subsequent stage phase shifting circuit 30C of the tuning amplifier section 2 can be replaced by the phase shifting circuits 10L and 30L as shown in FIGS. 14 and 16, respectively.

Now, the tuning frequency is determined by the time constants of the LR circuits included in the phase shifting circuits 10L and 30L. The time constant is for example L/R and the tuning frequency ω of the tuning amplifier section including the two phase shifting circuits 10L, 30L is proportional to 1/T=R/L. It is to be noted, here, that the inductor comprising the LR circuit can be formed on a semiconductor substrate by a spiral conductor made by photo-etching or other technology. The use of such particular inductor makes it possible to fabricate the entire tuning amplifier section on a semiconductor substrate as an integrated circuit.

However, since the inductance of such inductor is fairly small, the tuning frequency becomes high. In other words, the tuning frequency of the tuning amplifier section is proportional to the inverse R/L of the time constant of the LR circuits in, for example, the phase shifting circuits 10L, 30L. The inductance L can be small by integrated circuit technology, thereby enabling to choose a high tuning frequency by forming the entire tuning amplifier section including the two phase shifting circuits 10L, 30L in an integrated circuit.

It is also possible in the tuning amplifier section 2 as shown in FIG.2 to replace either one of the phase shifting circuits 10C, 30C by the phase shifting circuit 10L or 30L as shown in FIG. 14 or 16. In particular, integrating such tuning amplifier section is effective for preventing the tuning frequency from varying due to temperature changes, thereby providing temperature compensation. More in detail, the time constant T of a CR circuit is equal to CR while that of an LR circuit is equal to L/R. The resistances R are in the numerator and denominator, respectively. In case of forming the resistors for the CR and LR circuits by using the semiconductor material by integrated circuit technology, the tuning frequency fluctuation due to temperature characteristic of such resistors is effectively restricted.

Although the tuning amplifier section 2 (or 3) as shown in FIG. 2 comprises a pair of phase shifting circuits which shift the phase in opposite directions to each other, such tuning amplifier section may comprise by combining a pair of phase shifting circuits of basically identical circuit configuration.

Figure 18:
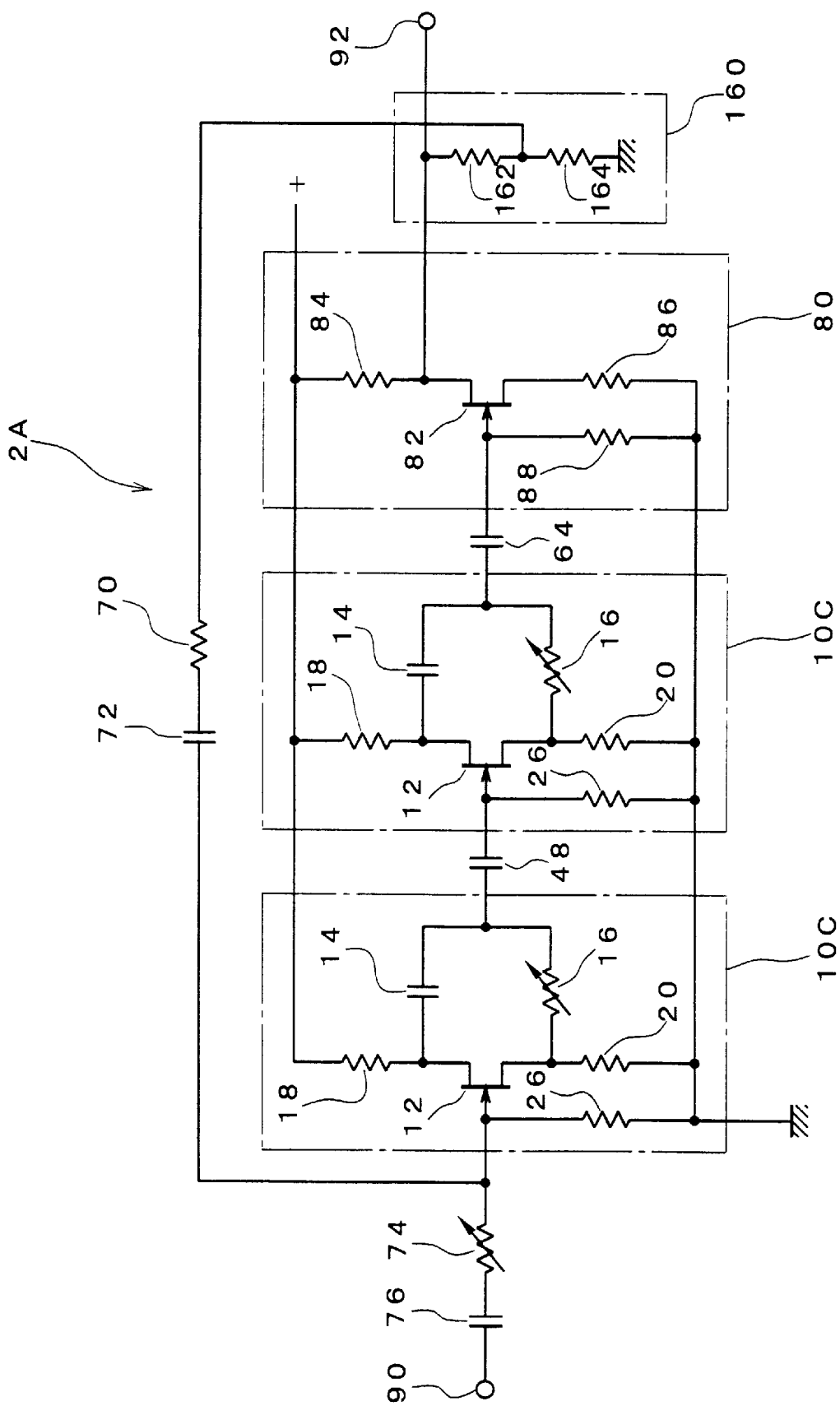
FIG. 18 is a circuit schematic of an alternative tuning amplifier section.

Shown in FIG. 18 is a circuit schematic of an alternative tuning amplifier section. The tuning amplifier section 2A in FIG. 18 comprises a pair of phase shifting circuit 10C, 10C for providing 180° phase shift in total of the input AC signal at a predetermined frequency, a phase inverter circuit 80 for inverting the phase of the output signal from the subsequent stage phase shifting circuit 10C, a voltage dividing circuit 160 comprising resistor 162, 164 disposed at the subsequent stage of the phase inverter circuit 80, and an adding circuit for summing at a predetermined ratio the divided output (feedback signal) of the voltage dividing circuit 160 through the feedback resistor 70 and the signal (input signal) applied to the input terminal 90 through the input resistor 74 (where the resistance of the input resistor 74 is equal to n times of that of the feedback resistor 70).

The detailed configuration and the phase relationship between the input and output signals of the front stage and the subsequent stage phase shifting circuits 10C, 10C are the same as described hereinbefore by reference to FIGS. 3 and 4. Let the time constant of the CR circuit comprising, for example, the variable resistor 16 and the capacitor 14 be $T_1$, then the phase shift φ1 at the frequency $\omega=1/T_1$ is lagging 90°. As a result, the total phase shift of the phase shifting circuits 10C, 10C is equal to 180°.

Now the phase inverter circuit 80 comprises a transistor 82 including a resistor 84 connected between its drain and a positive voltage source and a resistor 86 connected between its source and ground, and a resistor 88 for applying a desired bias voltage to the gate of the transistor 82. When an AC signal is applied to the gate of the transistor 82, an inverted phase signal is derived from the drain of the transistor 82. The phase inverter circuit 80 has a predetermined amplification factor to be determined by the resistance ratio of the two resistors 84, 86.

As described above, the two phase shifting circuits 10C, 10C shift the phase 180° at a predetermined frequency and the phase inverter circuit 80 connected at the subsequent stage inverts the phase, thereby providing total 360° phase shift by the three circuits.

The output from the phase inverter circuit 80 is derived from the output terminal 92 as the output of the tuning amplifier section 2A and also fed back to the input side of the front stage phase shifting circuit 10C by way of the voltage dividing circuit 160 and the feedback resistor 70. The feedback signal is summed with the input signal through the input resistor 74 and the summed signal voltage is applied to the input end of the front stage phase shifting circuit 10C.

In this manner, the open loop gain of the feedback loop is set to 1 or less by feeding back the output of the voltage dividing circuit 160 to the input side of the front stage phase shifting circuits 10C through the feedback resistor 70, summing with the input signal through the input resistor 74, and adjusting the dividing ratio of the voltage dividing circuit 160 and the gain of the phase inverter circuit 80. This ensures that the circuit performs the similar tuning and amplifier operations to the tuning amplifier section 2 as shown in FIG. 2.

Shown in FIG. 19 is a circuit schematic of still another configuration of the tuning amplifier section. The tuning amplifier section 2B in FIG. 19 comprises a pair of phase shifting circuits 30C, 30C for providing total 180° phase shift by shifting the phase of an input AC signal at a predetermined frequency, a phase inverter circuit 80 for inverting the phase of the output signal from the subsequent stage phase shifting circuit 30C, a voltage dividing circuit 160 comprising resistors 162, 164 provided at the subsequent stage of the phase inverter circuit 80, and an adding circuit for summing at a predetermined ratio the divided output (feedback signal) from the voltage dividing circuit 160 through a feedback resistor 70 and the signal (input signal) applied to the input terminal 90 through an input resistor 74.

The detailed configuration and the phase relationship between the input and output signals of the front and subsequent stage phase shifting circuits 30C, 30C are the same as described above by reference to FIGS. 5 and 6. Let the time constant of the CR circuit comprising, for example, the variable resistor 36 and the capacitor 34 be $T_2$, then the phase shift $\phi 2$ at the frequency $\omega = 1/T_2$ is 270° (phase inverted and lagged by 90°) and the overall phase shift of the two phase shifting circuits 30C, 30C is equal to 180°.

As understood from the above description, the use of the two phase shifting circuits 30C, 30C provides 180° phase shift at a predetermined frequency and the phase is further inverted by the phase inverter circuit 80 connected to the subsequent stage, thereby providing total 360° phase shift by three circuits.

Consequently, the above mentioned tuning amplifier section 2B performs the tuning and amplifier operations similar to the tuning amplifier section 2A as shown in FIG. 18 by feeding back the output of the voltage dividing circuit 160 to the input side of the input stage phase shift circuit 30C through the feedback resistor 70, summing the input signal through the input resistor 74 with the feedback signal, and setting the open loop gain of the feedback loop to 1 or less by adjusting the gain of the phase inverter circuit 80 and the dividing ratio of the voltage dividing circuit 160.

Although both tuning amplifier sections 2A, 2B as shown in FIGS. 18 and 19 comprise two phase shifting circuits each including CR circuit, it is to be noted that at least one of the phase shifting circuits may comprise LR circuit.

In particular, in the tuning amplifier section 2A as shown in FIG. 18, either one of the front and subsequent stage phase shifting circuit 10C is replaced by the phase shifting circuit 10L as shown in FIG. 14. Alternatively, both of the phase shifting circuits 10C, 10C are replaced by the above mentioned phase shifting circuits, 10L, 10L.

On the other hand, in the tuning amplifier section 2B as shown in FIG. 19, either front stage or subsequent stage phase shifting circuit 30C is replaced by the phase shifting circuit 30L as shown in FIG. 16. Alternatively, both phase shifting circuits 30C are replaced by the above mentioned phase shifting circuits 30L.

In particular, if both phase shifting circuits are replaced by the phase shifting circuits including LR circuits, each tuning amplifier section may be fabricated in an integrated circuit for easily increasing the tuning frequency. On the other hand, if one of the phase shifting circuits is replaced by one including LR circuit, tuning frequency drift due to temperature change can be prevented, thereby providing temperature compensation.

Although each of the above tuning amplifier sections includes the voltage dividing circuit 160 interposed between the subsequent stage phase shifting circuit 30C and the like and the output terminal 92 for feeding back the divided signal of the voltage dividing circuit 160, such voltage dividing circuit 160 may be eliminated.

Figure 20:
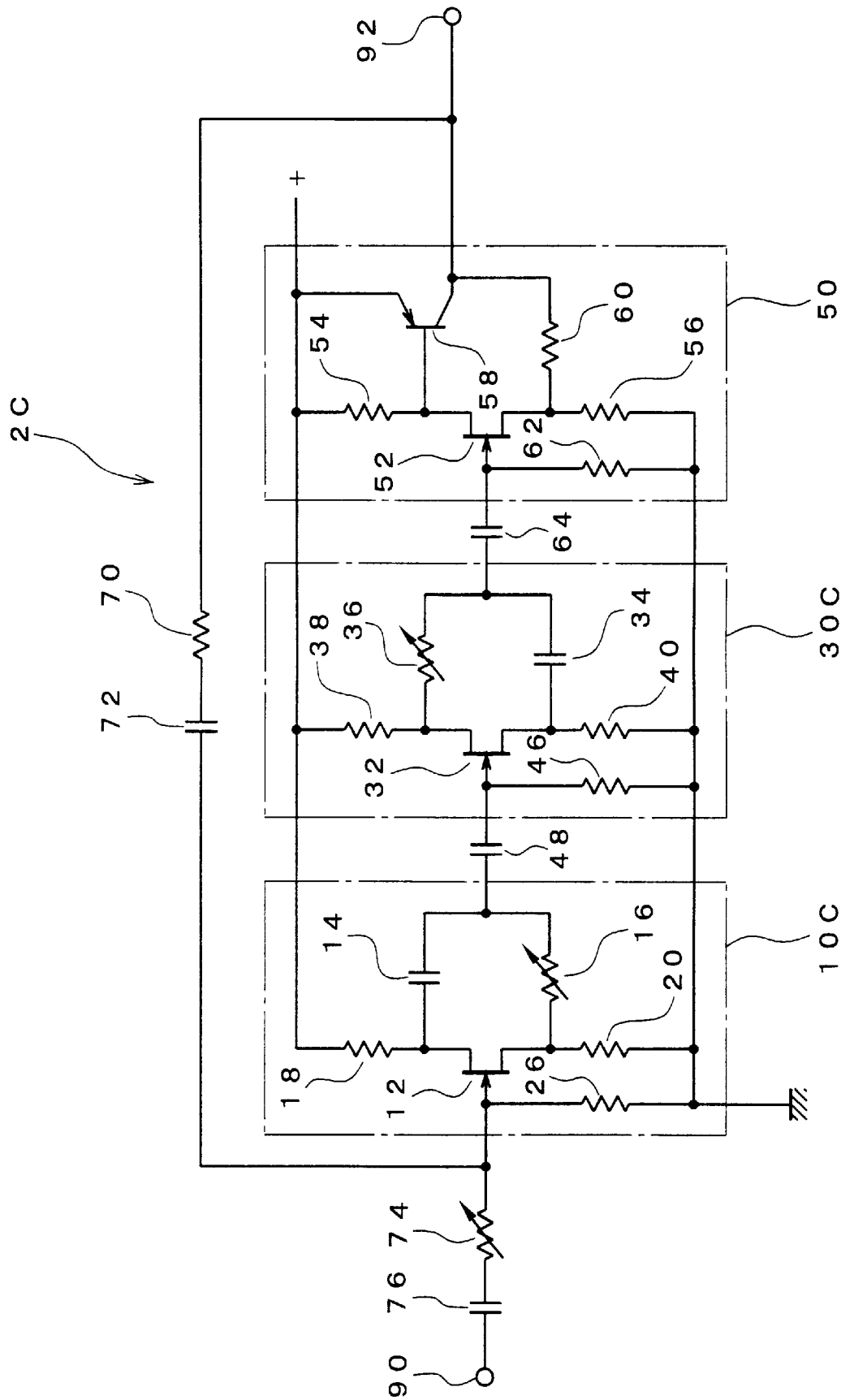
FIG. 20 is a circuit schematic of yet another tuning amplifier section.
Figure 21:
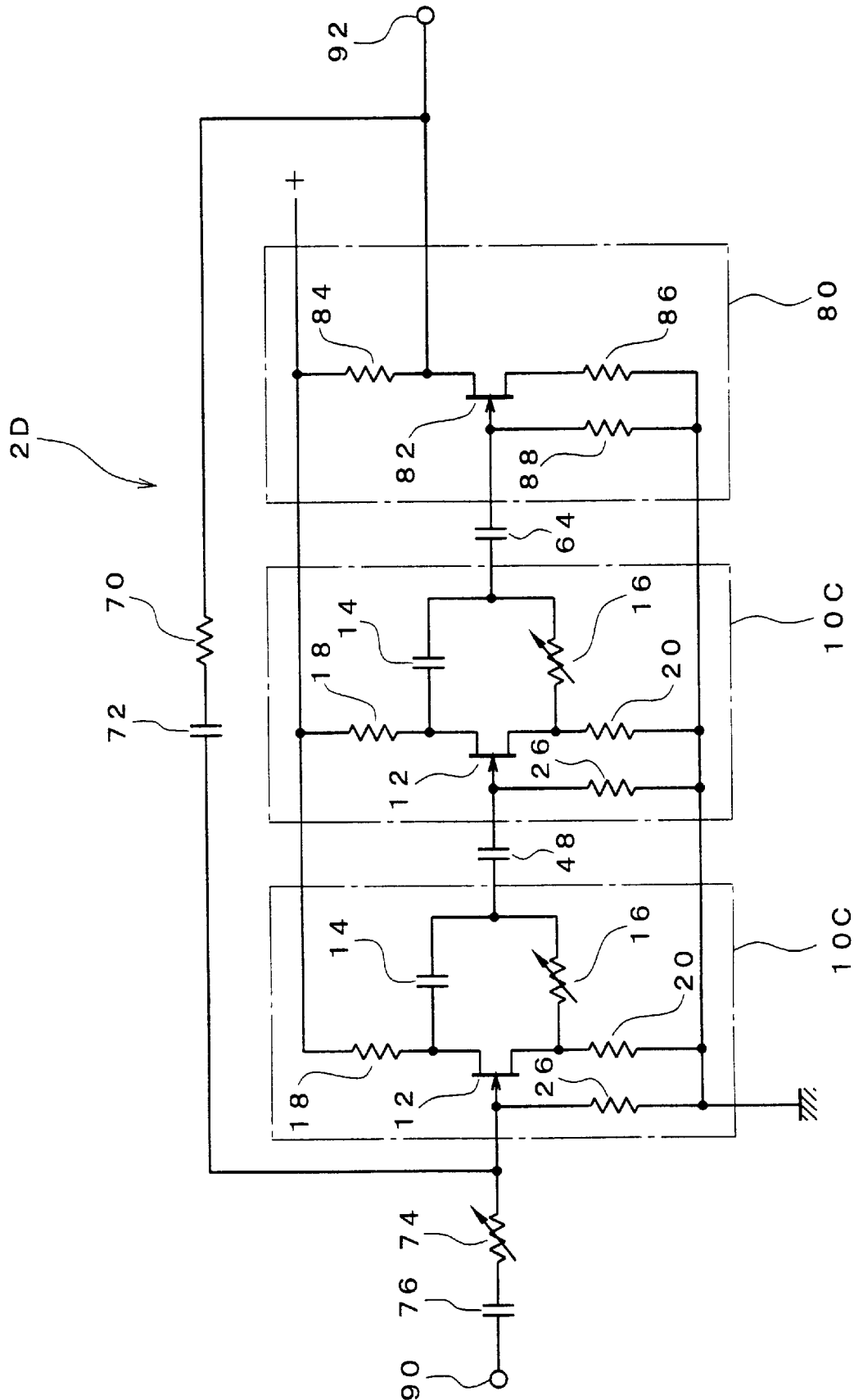
FIG. 21 is a circuit schematic of yet another tuning amplifier section.
Figure 22:
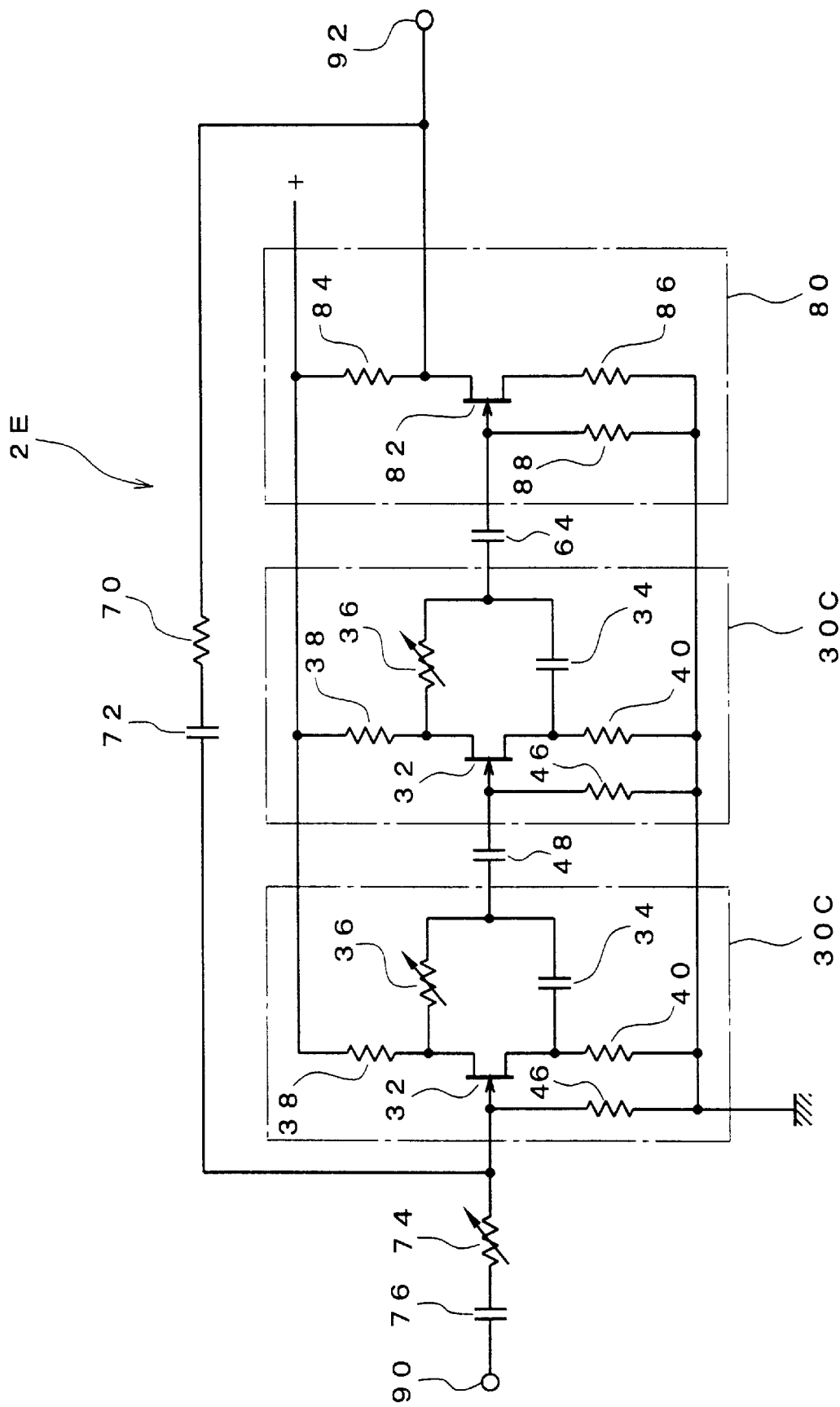
FIG. 22 is a circuit schematic of yet another tuning amplifier section.

Shown in FIGS. 20, 21 and 22 are circuit schematics of the tuning amplifier section excluding the voltage dividing circuit 160. The tuning amplifier section 2C as shown in FIG. 20 is a circuit schematic of the tuning amplifier section 2 as shown in FIG. 2 excluding the voltage dividing circuit 160. The tuning amplifier section 2D as shown in FIG. 21 is a circuit schematic of the tuning amplifier section 2A as shown in FIG. 18 excluding the voltage dividing circuit 160. The tuning amplifier section 2E as shown in FIG. 22 is the tuning amplifier section 2B as shown in FIG. 19 excluding the voltage dividing circuit 160.

It is to be noted that removing the voltage dividing circuit 160 means to set the dividing ratio of the voltage dividing circuit 160 to 1. This may suggest that the tuning amplifier sections 2C, 2D and 2E excluding the voltage dividing circuit 160 are included in the tuning amplifier sections as shown in FIG. 2 and the like.

Although the above mentioned various tuning amplifier sections 2 and the like comprise a pair of phase shifting circuits and a non-inverting circuit or a pair of phase shifting circuits and a phase inverting circuit such three circuits are connected so that the total phase shift is 360+ at a predetermined frequency, thereby performing the intended tuning operation. As a result, there is a certain freedom in connecting either one of a pair of phase shifting circuits at the input stage of the order of connecting the three circuits as long as the phase shift is concerned.

Shown in FIGS. 23(A)–23(C) are various connections of the tuning amplifier section comprising different combinations of a pair of phase shifting circuits and a non-inverting circuit 50. It is to be noted that the feedback impedance element 70a and the input impedance element 74a are adapted to sum the output and input signals of the tuning amplifier section at a predetermined ratio. A most typical example of the feedback and input impedance elements 70a and 74a are feedback and input resistors 70, 74 as shown in FIG. 2.

However, it is to be noted that the feedback and input impedance elements 70a, 74a may be capacitors or a combination of a resistor and a capacitor capable of simultaneously adjusting the ratio of the real and imaginary parts of the impedance for summing the signals applied thereto without changing the phase relationship.

Although the voltage dividing circuit 160 is excluded in the tuning amplifier sections in FIGS. 23(A)–23(C) and also in FIGS. 24(A)14 24(A) which will be described hereinafter, if it is desired to connect such voltage dividing circuit 160 at the subsequent stage of the final stage, the divided signal is used as the feedback signal and the non-divided signal is derived as the output signal.

Shown in FIG. 23(A) is a circuit arrangement with the non-inverting circuit 50 disposed at the subsequent stage of a pair of phase shifting circuits. This circuit arrangement corresponds to the tuning amplifier section 2 or 2C as shown in FIG. 2 or FIG. 20. This particular arrangement having the non-inverting circuit 50 at the subsequent stage is effective to extract a larger output current because the non-inverting circuit 50 serves as the output buffer.

Shown in FIG. 23(B) is a circuit arrangement with the non-inverting circuit 50 interposed between a pair of phase shifting circuits. In case of interposing the non-inverting circuit 50 in the middle, it is useful for completely preventing interaction between the front and subsequent stage phase shifting circuits.

Shown in FIG. 23(C) is a circuit arrangement with the non-inverting circuit 50 disposed at the preceding stage of a pair of phase shifting circuits. In this particular arrangement having the non-inverting circuit 50 at the front stage, it is useful for preventing any loss which may occur at the junction point of the feedback and input feedback elements and the non-inverting circuit 50.

Similarly, shown in FIGS. 24(A)–24(C) are various connections of the tuning amplifier section comprising different combinations of a pair of phase shifting circuits and a phase inverter circuit 80.

Shown in FIG. 24(A) is a circuit arrangement with the phase inverter circuit 80 disposed at the subsequent stage of a pair of phase shifting circuits. This circuit arrangement corresponds to the tuning amplifier section 2A or 2B as shown in FIG. 18 or FIG. 19. This particular arrangement having the phase inverter circuit 80 at the subsequent stage is effective to extract a larger output current because the phase inverter circuit 80 serves as the output buffer.

Shown in FIG. 24(B) is a circuit arrangement with the phase inverter circuit 80 interposed between a pair of phase shifting circuits. In case of interposing the phase inverter circuit 80 in the middle, it is useful for completely preventing interaction between the front and subsequent stage phase shifting circuits. Shown in FIG. 24(C) is a circuit arrangement with the phase inverter circuit 80 disposed at the preceding stage of a pair of phase shifting circuits. In this particular arrangement having the phase inverter circuit 80 at the front stage, it is useful for preventing any loss which may occur at the junction point of the feedback and input feedback elements and the phase inverter circuit 80.

It is to be noted that the present invention is not limited only to the above mentioned embodiments and that various modifications can be made without departing from the scope of the present invention.

For example, the variable resistors 16, 36 included in the tuning amplifier sections constituting the above tuning circuits may be replaced by channel resistances of junction type or MOS type FETs for convenience of integrating on a semiconductor substrate. In such case, resistance between the source and drain electrodes of such FET can be controlled by varying the gate voltage.

Also, the variable resistors 16, 36 may be configured using a parallel connection of a p-channel and n-channel FETs. A variable resistor comprising a combination of such FETs helps to improve linearity of the FETs, thereby providing a tuning output with minimum distortion.

Although variable resistors are included in the two phase shifting circuits of the aforementioned various tuning amplifier sections, a variable resistor may be included in either one of the phase shifting circuits to control the tuning frequency. The use of a variable resistor in each of the two phase shifting circuits is advantageous to provide a wider variable range of the tuning frequency. In case of including a variable resistor in only one phase shifting circuit, it is advantageous to easily control the tuning frequency.

It is also possible to form the variable resistor by using a PIN diode through which a variable current is made to flow, thereby controlling the resistance between both ends of the PIN diode.

Also, in the phase shifting circuit having a CR circuit, the time constant of such CR circuit may be varied by controlling the capacitance of the capacitor instead of controlling the resistance of the resistor, thereby varying the phase shift of the phase shifting circuit or the tuning frequency of the tuning amplifier section.

More in detail, the capacitor (for example the capacitor 14 in FIG. 3) constituting the CR circuit is replaced by a variable capacitance diode and a DC blocking capacitor. Application of a variable reverse bias voltage to the variable capacitance diode varies the capacitance between the anode and the cathode. If a CR circuit is formed with a series connection of such variable capacitance diode and a resistor, the time constant of the CR circuit can be varied depending on the reverse bias voltage applied to the diode, thereby shifting the phase of the phase shifting circuit. Also, the variable capacitance diode may be replaced by an FET whose gate capacitance varies in certain range depending on the control voltage to the gate.

Similarly, in a phase shifting circuit having an LR circuit, the time constant of the LR circuit may be controlled by varying the inductance of a variable inductor instead of varying the resistance of a variable resistor, thereby shifting the phase of the phase shifting circuit or varying the tuning frequency of each tuning amplifier section.

Figure 25:
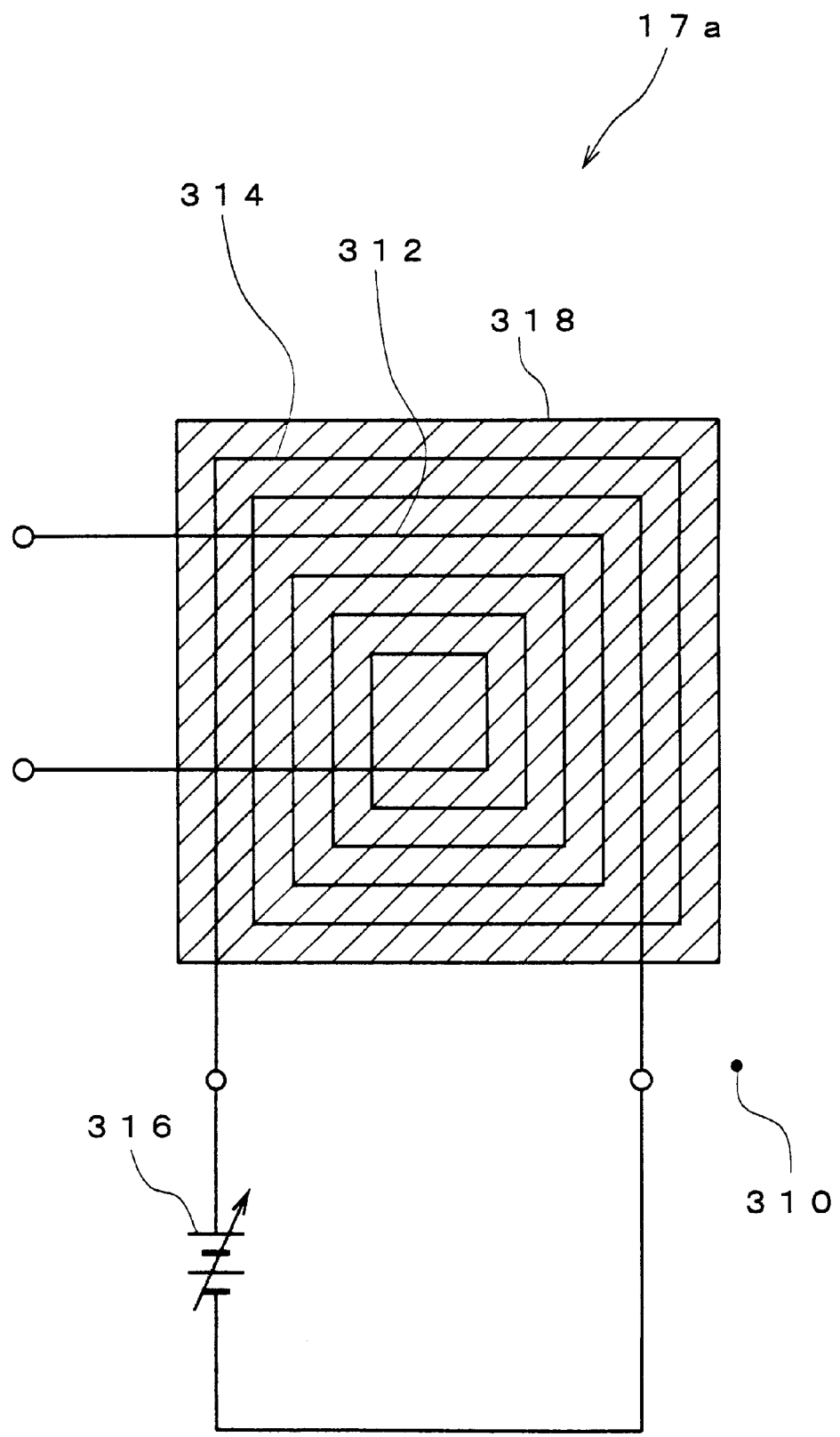
FIG. 25 is an example of a variable inductor.

Illustrated in FIG. 25 is a simplified planar configuration of a variable inductor formed on a semiconductor substrate.

The variable inductor 17a shown in FIG. 25 comprises a spiral shaped inductor conductor 312 formed on a semiconductor substrate 310, a control conductor 314 formed about the inductor conductor 312 and an insulating magnetic member 318 covering the inductor conductor 312 and the control conductor 314.

The above mentioned control conductor 314 is designed to be connected to a variable voltage source 316 at both ends of the control conductor 314. By controlling the DC bias voltage of the variable voltage source 316, a variable bias current flows through the control conductor 314.

The semiconductor substrate 310 may be made from, for example, n-type silicon substrate (n-Si substrate) or any other semiconductor material (for example, amorphous material such as germanium, amorphous silicon, etc.). The inductor conductor 312 may be made from a thin film of aluminum, gold, etc. or polysilicon or other semiconductor material in spiral form. Note that formed on the semiconductor substrate 310 are variable inductor 17a and other components of the tuning amplifier section as shown in FIG. 2, etc.

Figure 26:
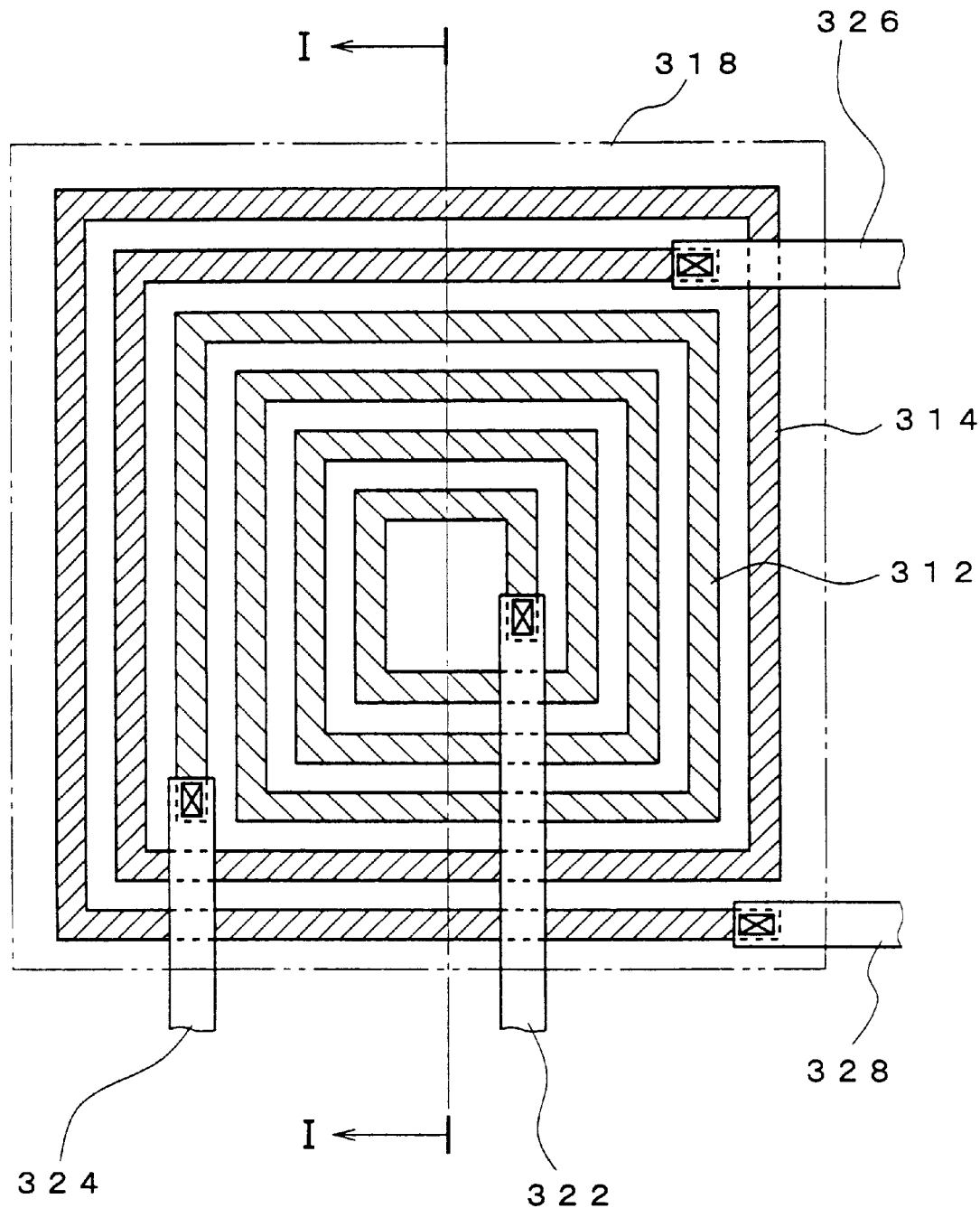
FIG. 26 shows the inductor conductor of the variable inductor in FIG. 25 and control conductors in greater detail.

Illustrated in FIG. 26 is a more detailed view of the inductor conductor 312 and the control inductor 314 constituting the variable inductor 17a as shown in FIG. 25.

As apparent from FIG. 26, the inductor conductor 312 is in a spiral form of a desired number of turns (for example 4 turns) inside the control conductor 314 and has a pair of terminal electrodes 322, 324 at both ends. Similarly, the control conductor 314 outside of the inductor conductor 312 is in a spiral form of a desired number of turns (for example 2 turns) and has a pair of terminal electrodes 326, 328 at both ends.

Figure 27:
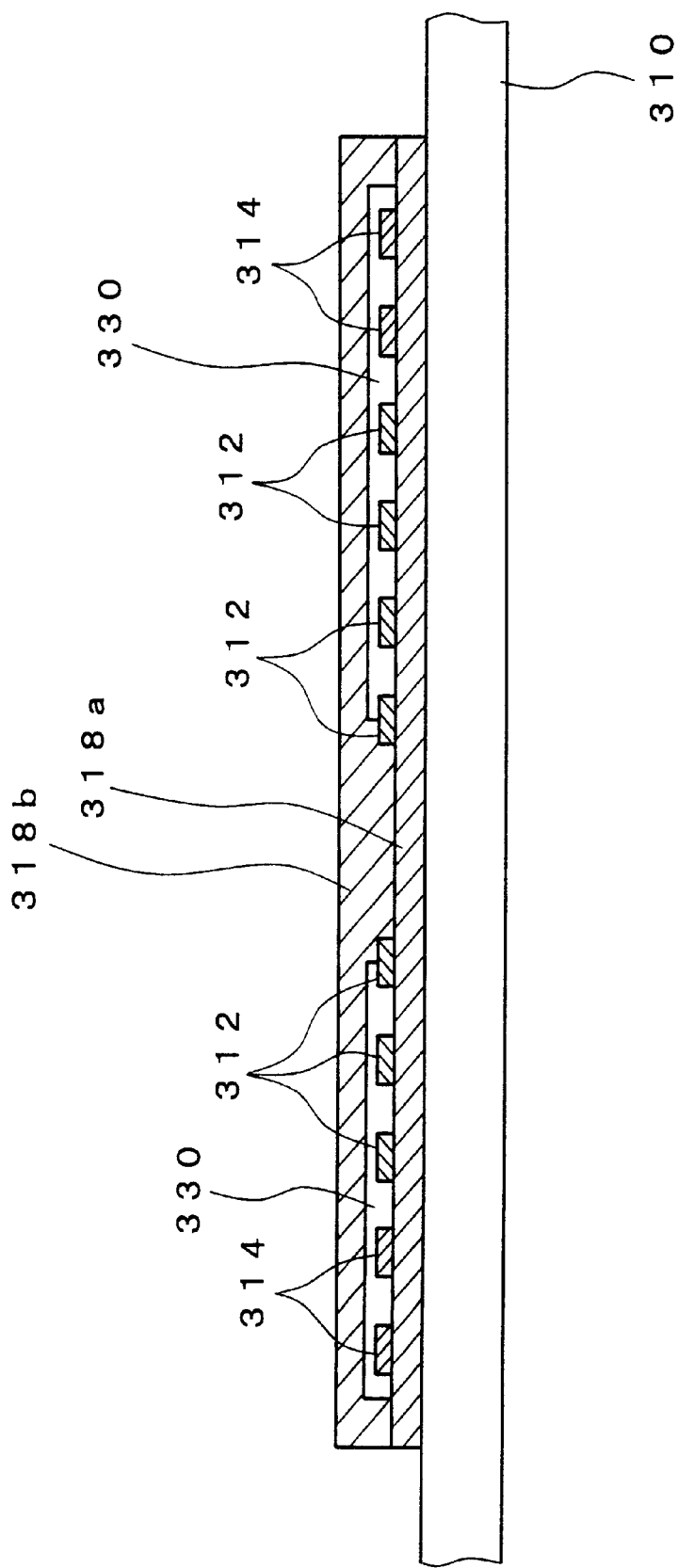
FIG. 27 is a magnified cross section view along line A—A in FIG. 26.

Now, illustrated in FIG. 27 is a magnified cross section view of the insulative magnetic member 318 including the inductor conductor 312 and the control conductor 314 along the line A—A in FIG. 26.

As best shown in FIG. 27, the inductor conductor 312 and the control conductor 314 are formed on the surface of the semiconductor substrate 310 by way of an insulative magnetic layer 318a. Also, another insulative magnetic layer 318b is coated over the conductors 312 and 314. The insulative magnetic member 318 as shown in FIG. 25 is defined by the two magnetic layers 318a and 318b.

The magnetic layers 318a and 318b may be made from, for example, gamma ferrite, barium ferrite, or other magnetic materials. Various materials and methods of making the magnetic member are available. For example, the magnetic layer may be made by vacuum deposition, molecule beam epitaxy (MBE method), chemical vapor deposition (CVD method), or sputtering method of, for example, FeO or other materials.

It is to be noted that an insulation layer 330 of non-magnetic material is disposed to cover the inductor conductor 312 and the control conductor 314. Displacing the magnetic layer 318a and 318b from the periphery of the conductor 312, helps to minimize leakage magnetic flux in this area, thereby providing a variable inductor 17a having a large inductance by effective use of the magnetic flux generated by the inductor conductor 312.

Such variable inductor 17a as shown in FIG. 25, etc. comprises the insulative magnetic member 318 (magnetic layers 318a and 318b) covering the inductor conductor 312 and the control conductor 314. A variable DC bias current is made to flow through the control conductor 314, thereby varying the saturated magnetization characteristic of the inductor conductor 312 having the insulative magnetic member 318 as its magnetic path. As a result, the inductance of the inductor conductor 312 is controlled.

The inductance of the inductor conductor 312 can be directly controlled and can be fabricated easily on the semiconductor substrate 310 using conventional thin film forming and semiconductor fabrication processes. Additionally, other circuit components and devices of the tuning amplifier section 2 may be formed on the semiconductor substrate 310, thereby enabling to form the entire tuning circuit 1 as an integrated circuit.

It is to be understood that the inductor conductor 312 and the control conductor 314 may be formed in a spiral manner alternately or superimposed to obtain the variable inductor 17a in FIG. 25. In any example, the DC bias current through the control conductor 314 is controlled to alter the saturation magnetization characteristic of the insulative magnetic member 318, thereby varying the inductance of the inductor conductor 312 over a certain range.

Although the variable inductor 17a in FIG. 25 is described to form the inductor conductor 312 on the semiconductor substrate 310, the inductor conductor 312 may be formed on any insulative or conductive substrate including ceramic, etc.

Also, an insulative material is used as the magnetic layers 318a, 318b in the above example, metal powder (MP) or other conductive material may be used so long as each inductor conductor is electrically insulated from such conductive magnetic layers to avoid shunting of the inductor conductor. Such insulation may be realized by forming an oxide film on the inductor conductor 312 or by forming a silicon oxide or nitride film by chemical vapor deposition or other technique.

In particular, electrically conductive magnetic materials such as metal powder tend to have higher magnetic permeability as compared with insulative magnetic materials such as gamma ferrite, thereby making them effective to increase the inductance.

In the variable inductor 17a in FIG. 25, both inductor conductor 312 and the control inductor 314 are entirely covered with the insulative magnetic member 318. However, a part of the conductors 312, 314 may be covered to form the magnetic path. In case of partly forming the magnetic path by the insulative (or conductive) magnetic member, the magnetic flux generated by the inductor conductor 312 and the control conductor 314 tends to saturate easily due to reduced magnetic path. This means that a small bias current in the control conductor 314 may saturate the flux, thereby enabling to control the inductance of the inductor conductor 312 using a small bias current. This helps to simplify the control circuit.

Although the inductor conductor 312 and the control conductor 314 in the variable inductor 17a in FIG. 25 are formed in a concentric spiral manner, these conductors 312, 314 may be formed at adjacent locations on the semiconductor substrate 310 with insulative or conductive magnetic member therebetween for forming a magnetic path for magnetic coupling between the both conductors.

Figure 28:
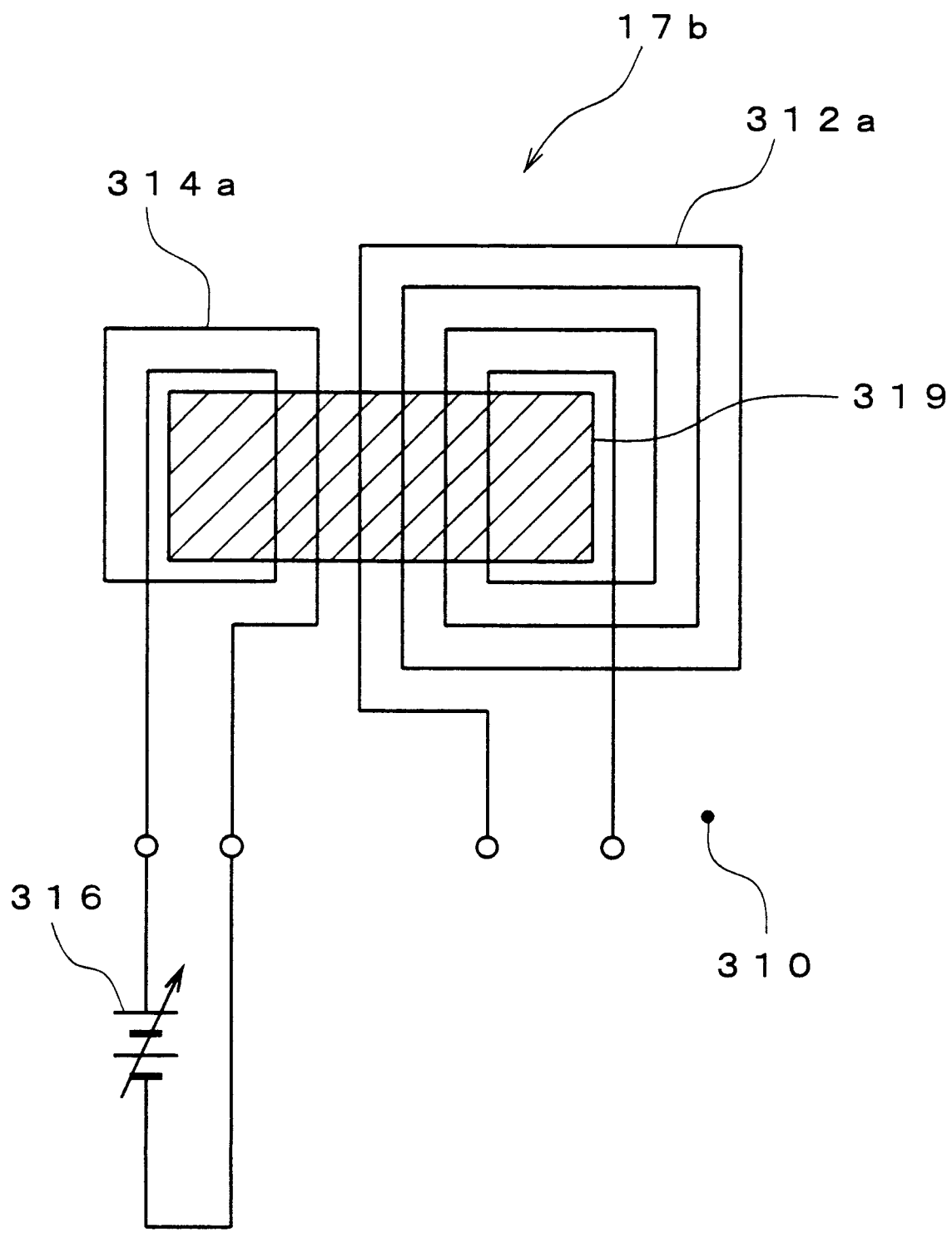
FIG. 28 is another example of a variable inductor.

Illustrated in FIG. 28 is a plan view of a variable inductor 17b including side-by-side inductor and control conductors.

The variable inductor 17b as shown in FIG. 28 comprises a spiral form inductor conductor 312a formed on a semiconductor substrate 310, a spiral form control conductor 314a formed at an adjacent location to the inductor conductor 312a, and an insulative (or conductive) magnetic member 319 covering center portions of the both spiral conductors 312a, 314a.

Similar to the variable inductor 17a in FIG. 25, connected to the control conductor 314a at both ends thereof is a variable voltage source 316 to apply a variable bias voltage. Controlling the bias voltage by the variable voltage source 316 varies the bias current through the control conductor 314a.

The above mentioned variable inductor 17b has an annular insulative magnetic member 319 (magnetic layers 319a, 319b) passing through the centers of the spiral inductor conductor 312a and the control conductor 314a. Controlling the DC bias current to flow through the control conductor 314a varies the saturation magnetization characteristic of the magnetic member 319 to define the magnetic path to the inductor conductor 312a, thereby varying the inductance of the inductor conductor 312a.

In a case where various tuning amplifier sections mentioned above are formed on a semiconductor substrate, it is difficult to form a capacitor 14 and the like having a large capacitance. It is therefore convenient to increase the apparent capacitance of such capacitor formed on a semiconductor substrate by using a circuit, thereby increasing the time constant T and thus decreasing the tuning frequency.

Figure 29:
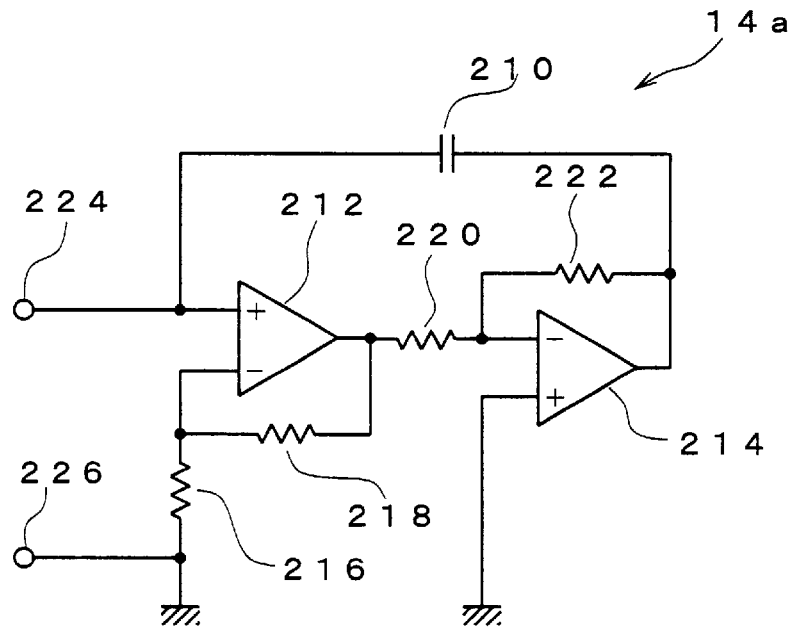
FIG. 29 is a circuit schematic of a capacitance converter circuit to magnify apparent capacitance of a capacitor.

Illustrated in FIG. 29 is an alternative example of a capacitor 14 and the like integrated with a circuit for use with the phase shifting circuit 10C in FIG. 3 and the like. This is a capacitance converter circuit to increase the apparent capacitance of the actual capacitor formed on a semiconductor substrate. The entire circuit of the capacitance converter circuit as shown in FIG. 29 is used as the capacitor 14 in the phase shifting circuit 10C.

The capacitance converter circuit 14a in FIG. 29 comprises a capacitor 210 having a capacitor C0, a pair of operational amplifiers 212, 214 and four resistors 216, 218, 220, and 222.

The first stage operational amplifier 212 includes the resistor 218 (having resistance R18) connected between the output terminal and the inverting input terminal and the resistor 216 (having resistance R16) connected between the inverting input terminal and ground.

Now, there is a relationship given by the following expression (8) between the voltage E1 applied to the non-inverting input terminal and the voltage E2 appearing on the output terminal of the first stage operational amplifier 212:

$$E2=(1+R18/R16)E1 \qquad (8)$$

The primary function of the first stage operational amplifier 212 is a buffer for impedance conversion and the gain of the first stage operational amplifier 212 may be 1. The unity gain is achieved when R18/R16=0, i.e., when R16 is ∞ (removing the resistor 216) or when R18 is 0 (directly connecting).

On the other hand, the second stage operational amplifier 214 includes the resistor 222 (having resistance R22) connected between the output terminal and the inverting input terminal and the resistor 220 (having resistor R20) connected between the inverting input terminal and the output terminal of the above operational amplifier 212. Also, the non-inverting input terminal is returned to ground.

Let the voltage appearing on the output terminal of the second stage operational amplifier 214 be E3, there is the following relationship between the voltage E3 and the output voltage E2 from the first stage operational amplifier 212:

$$E3=-(R22/R20)E2 \qquad (9)$$

As understood from the above expression (9), the second stage operational amplifier 214 acts as an inverting amplifier and the first stage operational amplifier 212 is used to establish a high input impedance of the second stage operational amplifier 214.

Now, connected between the non-inverting input terminal of the first stage operational amplifier 212 and the output terminal of the second stage operational amplifier 214 is the capacitor 210 having the above capacitance C0.

Figure 30:
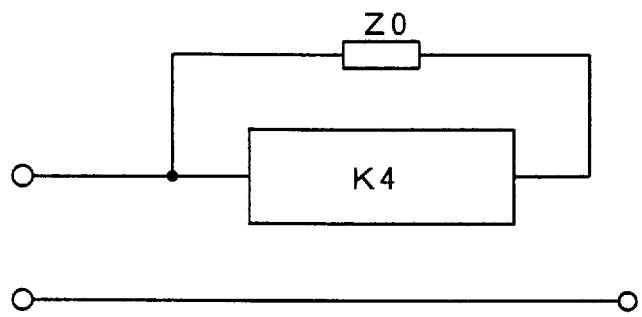
FIG. 30 is a diagram of the circuit in FIG. 29 using a transfer function.

If the transfer function of the entire circuit of the capacitance converter circuit 14a in FIG.29, excluding the capacitor 210 is K4, the capacitance converter circuit 14a can be represented by the system diagram in FIG. 30. Illustrated in FIG. 31 is a system diagram of the circuit in FIG. 30 further converted by using the Miller's principle.

Figure 31:
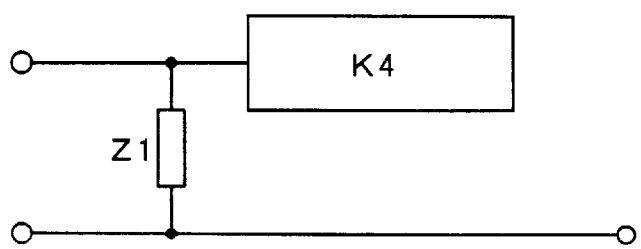
FIG. 31 is a diagram of the circuit in FIG. 30 converted by using the Miller's principle.

The impedance Z1 in FIG. 31 can be represented by the following expression (10) by using the impedance Z0 in FIG. 30:

$$Z1=Z0/(1-K4) \qquad (10)$$

In the capacitance converter circuit 14a in FIG. 29, the impedance $Z0=1/(j\omega C0)$. This is incorporated in the expression (10) to obtain the following expressions (11), (12):

$$Z1 = (1/(j\omega C0))/(1-K4) \qquad (11)$$
$$= 1/\{j\omega((1-K4)C0)\}$$

$$C = (1-K4)C0 \qquad (12)$$

The above expression (12) suggests that the apparent capacitance of the capacitor 210 having the capacitance C0 in the capacitance converter circuit 14a is increased to $(1-K4)$ times of C0. As a result, if the gain K4 of the amplifier is negative, $(1-K4)$ is always greater than 1, thereby increasing the capacitance C0.

Incidentally, the gain of the amplifier in the capacitance converter circuit 14a in FIG. 29, i.e., the gain K4 of the amplifier comprising the entire operational amplifiers 212, 214 can be determined from the above expressions (8) and (9) as follows:

$$K4=-(1+R18/R16)R22/R20 \qquad (13)$$

Now, incorporating the above expression (13) with the expression (12), $$C=\{1+(1+R18/R16)R22/R20\}C0 \qquad (14)$$

By proper setting of the resistances of the four resistors 216, 218, 220 and 222, the apparent capacitance C between the two terminals 224, 226 can be increased.

In case of the gain of the first stage operational amplifier 212 is 1, i.e., when R16 is set ∞ (by removing the resistor 216) or R18 is 0Ω so that R18/R16=0, the above expression (14) can be simplified as follows:

$$C=(1+R22/R20)C0 \qquad (15)$$

As apparent from the above expression (15), the above capacitance converter circuit 14a acts to increase the apparent capacitance of the capacitor 210 formed on the semiconductor substrate larger than the actual capacitance C0 by varying the resistance ratio R18/R16 of the resistors 216, 218 or R22/R20 of the resistors 220, 222. In case of forming the entire tuning amplifier section in FIG. 2 on a semiconductor substrate, the capacitor 210 having a small capacitance C0 on a semiconductor substrate and the apparent capacitance C can be increased by the circuit as shown in FIG. 29, thereby making it particularly suitable for integrated circuit. Especially, if it is possible to establish a larger capacitance, the area for forming the tuning amplifier section can be reduced, thereby reducing the material cost.

Also, at least one of the resistors 216, 218, 220, 222 is made as a variable resistor, more particularly by a junction type or MOS type FET or parallel connection of a p-channel FET and an n-channel FET, thereby easily forming a variable capacitance capacitor. The use of such capacitor replacing the variable capacitance diode helps to control the phase shift over a certain range. This enables to control the frequency at which the phase shift of the tuning amplifier section is 0° in a loop.

Since the first stage operational amplifier 212 is used as a buffer to increase the input impedance as described above, the operational amplifier 212 may be replaced by an emitter follower circuit or a source follower circuit.

Although in FIG. 29 an amplifier having a predetermined gain and a capacitor are combined to increase the apparent capacitance higher than the capacitance of the actual capacitance element, an inductor may be used instead of the capacitor and the apparent inductance of such inductor will be increased.

The impedance Z1 as shown in FIG. 31 is given by the expression (10) by using the impedance Z0 as shown in FIG. 30. In case of an inductor having the inductance L0, the impedance $Z0=j\omega L0$. This is incorporated with the expression (10), then $$Z1=j\omega L0/(1-K4)=j\omega L\{L0/(1-K4)\} \qquad (16)$$

$$L=L0/(1-K4) \qquad (17)$$

This expression (17) shows that the actual inductor element is increased in apparent by $1/(1-K4)$ times. If the gain K4 is set to any value between 0 to 1, the apparent capacitance is increased.

Figure 32:
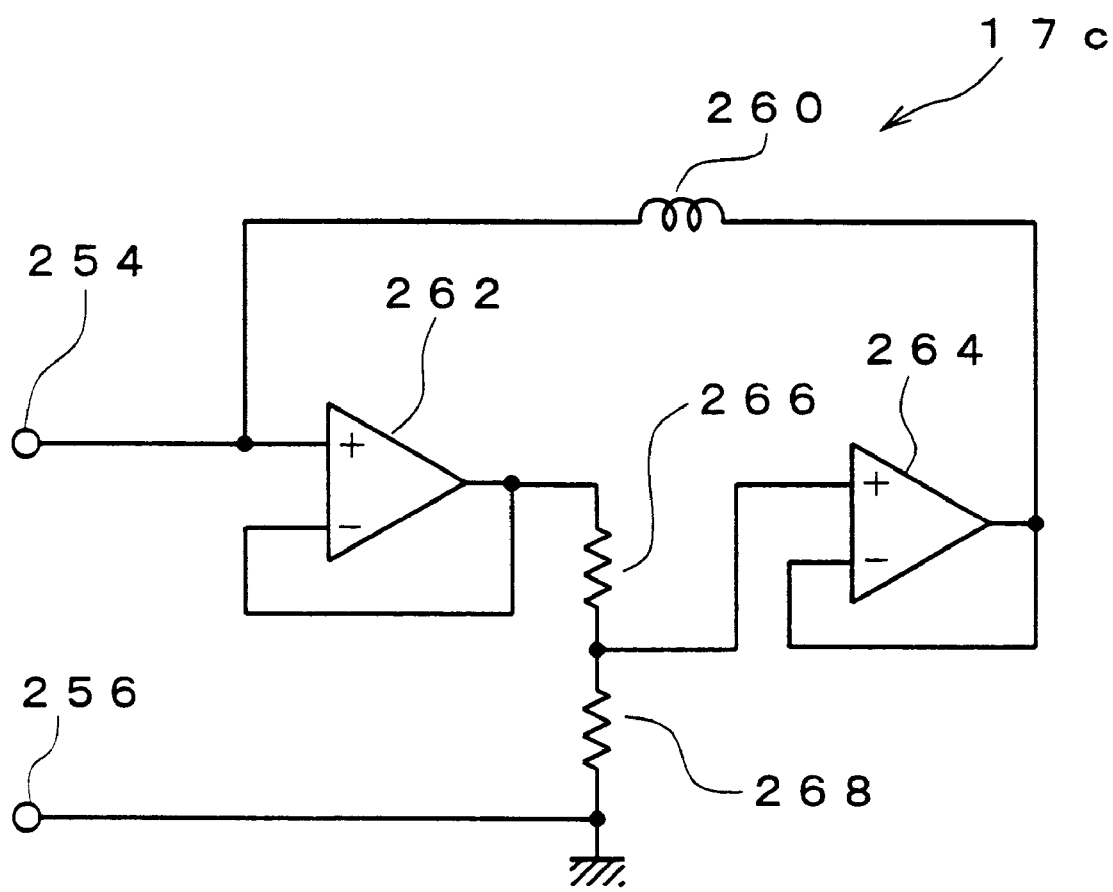
FIG. 32 is a circuit schematic of an inductance converter circuit to magnify apparent inductance of an inductor.

Now, illustrated in FIG. 32 is an alternative circuit to replace the inductor 17 within the phase shifting circuit 10L as shown in FIG. 14. The circuit in FIG. 32 is an inductance converter circuit to increase the apparent inductance of the inductor element (inductor conductor) formed on a semiconductor substrate.

The inductance converter circuit 17c in FIG. 32 comprises an inductor 260 having a given inductance L0, a pair of operational amplifiers 262, 264 and a pair of resistors 266, 268.

The first stage operational amplifier 262 is a unity gain non-inverting amplifier having its output terminal coupled to its inverting input terminal, thereby acting as a buffer primarily for impedance converter. Similarly, the second stage operational amplifier 264 has its output terminal coupled to its inverting input terminal to act as a unity gain non-inverting amplifier. Also included between the two non-inverting amplifiers is a voltage dividing circuit comprising resistors 266, 268.

By inserting the voltage dividing circuit, the overall gain of the amplifier including the two operational amplifiers can be set to any value between 0 to 1.

In the inductance converter circuit 17c in FIG. 32, let the transfer function of the entire circuit (amplifier) excluding the inductor 260 be K4, the gain K4 is determined by the dividing ratio of the voltage dividing circuit comprising the resistors 266, 268. If the resistances of the resistors 266 and 268 are R66 and R68, K4 is given by the following expression (18):

$$K4 = R68/(R66+R68) \quad (18)$$

The gain K4 is incorporated with the above expression (17) to calculated the apparent inductance, $$L = L0/\{1 - R68/(R66 + R68)\} \quad (19)$$
$$= (1 + R68/R66)L0$$

As a result, by increasing the resistance ratio R68/R66 of the resistors 266 and 268, the apparent inductance L between two terminals 254 and 256 can be increased. For example, in case of R68=R66, it is understood from the above expression (19) that the apparent inductance L is twice as large as L0.

As a result, the above mentioned inductance converter circuit 17c is useful for increasing the apparent inductance by controlling the dividing ratio of the voltage dividing circuit interposed between the two non-inverting amplifiers as composed with the actual inductance L0 of the inductor 260. This is particularly advantageous in case of forming the tuning amplifier section on a semiconductor substrate because the inductor 260 having a small inductance L0 may be formed on a semiconductor substrate by a spiral conductor and converting it into a larger inductance L by the inductance converter circuit as shown in FIG. 32. Especially, if the inductance can be increased to a certain large value, the tuning frequency of the tuning amplifier section can be extended to a lower frequency range. Additionally, forming the entire circuit as an integrated circuit, the tuning amplifier section requires a small area, thereby reducing the material cost.

Other than fixing the dividing ratio of the voltage dividing circuit comprising the resistors 266, 268, at least one of the two resistors 266, 268 may be made by a variable resistor, for example, by a parallel connection of p-channel and n-channel FETs, a junction type FET or a MOS type FET so that the dividing ratio may be continuously variable. In such case, the gain of the entire amplifier including the two operational amplifiers 262, 264 in FIG. 32 varies, thereby providing a continuously variable inductance L between the two terminals 254, 256. The use of such inductance converter circuit 17c instead of a variable inductor helps to provide a variable phase shift of the phase shifting circuit in a certain range. As a result, the frequency to provide 360° phase shift in the loop of the tuning amplifier section can be altered, thereby controlling the tuning frequency to a desired value.

Since the gain of the entire amplifier including the two operational amplifiers 262, 264 constituting the inductance converter circuit 17c in FIG. 32 is set less than 1, the entire circuit may be replaced by an emitter follower circuit or a source follower circuit.

Although the above mentioned two tuning amplifier sections 2, 3 are described to have identical construction to each other, it is possible to cascade connect two different types of tuning amplifier sections. For example, the tuning amplifier section 2A or 2B as shown in FIG. 18 or 19 may be replaced for the tuning amplifier section 3 as shown in FIG. 1. Alternatively, a tuning amplifier section with at least one phase shifting circuit of the above mentioned tuning amplifier section 2, 2A, 2B replaced by the phase shifting circuit 10L, 30L as shown in FIG. 14 or 16 may be replaced for the tuning amplifier section 3 as shown in FIG. 1. Needless to say that the two tuning amplifier sections 2, 3 may be connected to each other in any order.

Possibility of Industrial Applications

As apparent from the above descriptions of the best mode of implementing the present invention, a plurality of tuning amplifier sections of substantially equal or mutually shifted tuning frequencies are cascade connected. Each of the tuning amplifier sections comprises a pair of full band pass phase shifting circuits, a non-inverting or phase inverter circuit and an adding circuit for summing the feedback signal and the input signal. As a result, the tuning circuit provides a predetermined maximum attenuation and a wider tuning bandwidth as compared with a circuit employing a single tuning amplifier section.

Additionally, the entire tuning circuit can be easily configured as an integrated circuit especially when the pair of phase shifting circuits in each tuning amplifier section include CR circuits. Similarly, if the pair of phase shifting circuits include LR circuits, small inductors may be formed by an integrated circuit technology, thereby providing higher tuning frequencies without any difficulty. In a case of using a CR circuit in one phase shifting circuit while an LR circuit in the other phase shifting circuit, operational performances can be stabilized regardless of temperature and other factors.

We claim:

1. A tuning circuit including a plurality of cascade connected tuning amplifier sections each having substantially equal tuning frequency, each of said tuning amplifier sections comprising:

an adding circuit for summing an input signal applied to one end of an input impedance element and a feedback signal applied to one end of a feedback impedance element;

a pair of phase shifting circuits of opposite directions of phase shift to each other, each including converter means for providing non-inverted and inverted AC signals of an input AC signal and combining means for combining one of said converted AC signals by way of a capacitor or an inductor and the other AC signal by way of a resistor;

a non-inverting circuit for amplifying an input AC signal by a predetermined amplification factor without changing the phase; and a voltage dividing circuit for dividing an input AC signal by a predetermined dividing ratio;

wherein said pair of phase shifting circuits, said non-inverting circuit and said voltage dividing circuit are connected in a cascade manner, the summed signal from said adding circuit is applied to the front stage circuit of said cascade connected circuits, the signal from the final stage circuit is applied to one end of said feedback impedance as the feedback signal, and the signal to be applied to said voltage dividing circuit is derived as the output signal, wherein the time constant of series circuit of said capacitor or inductor and said resistor constituting said combining means is varied to adjust the tuning characteristics, wherein said resistor in said combining means is a variable resistor for adjusting the tuning characteristics in response to the resistance of said variable resistor; and wherein said variable resistor is formed by a parallel connection of p-channel and n-channel FETs to provide variable channel resistance depending on their gate voltage.

2. The tuning circuit of claim 1, wherein said converter means included in each of said pair of phase shifting circuits comprises a transistor for receiving an input AC signal at the gate or base thereof resistors having substantially equal resistance connected to the source and drain or the emitter and collector of said transistor, and a series circuit of said capacitor or said inductor and said resistor is connected between the source and grain or the emitter and collector of said transistor.

3. The tuning circuit of claim 1, wherein each of said feedback and input impedance elements is a resistor and the resistance ratio of said resistors is varied to adjust the tuning frequency bandwidth of said tuning amplifier section.

4. The tuning circuit of claim 1, wherein the dividing ratio of said voltage dividing circuit is set to 1.

5. The tuning circuit of claim 1, wherein the inductor in said combining means is formed on a semiconductor substrate and includes a pair of spiral electrodes magnetically coupled to each other by way of a magnetic member with a variable DC bias current made to flow one of said spiral electrodes for controlling the inductance of the other spiral electrode.

6. The tuning circuit of claim 1, wherein the capacitor in said combining means comprises a capacitance converter circuit including a negative gain amplifier and a capacitance element connected between the input and output of said amplifier.

7. The tuning circuit of claim 1, wherein the inductance in said combining means comprises an inductance converter circuit including an amplifier having a gain set between 0 and 1, and an inductance element connected between the input and output of said amplifier.

8. A tuning circuit comprising a plurality of cascade connected tuning amplifier sections having substantially equal tuning frequencies, each of said tuning amplifier sections comprising:

an adding circuit for summing an input signal applied to one end of an input impedance element and a feedback signal applied to one end of a feedback impedance element;

a pair of phase shifting circuits of the same phase shift direction, each including converter means for converting an input AC signal into non-inverted and inverted AC output signals, and combining means for combining one of the converted AC output signals through a capacitor or an inductor and the other AC output signal through a resistor;

a phase inverting circuit for inverting the phase of the AC input signal and amplifying with a predetermined amplification factor; and a voltage dividing circuit for dividing the input AC signal by a predetermined dividing ratio;

wherein said pair of phase shifting circuits, said phase inverting circuit and said voltage dividing circuit are cascade connected with the summed signal from said adding circuit applied to the front stage of said cascade connected circuits, the output signal from the final stage applied to one end of said feedback impedance element as the feedback signal and the input signal to said voltage dividing circuit derived as the output signal, wherein the time constant of series circuit of said capacitor or inductor and said resistor constituting said combining means is varied to adjust the tuning characteristics, wherein said resistor in said combining means is a variable resistor for adjusting the tuning characteristics in response to the resistance of said variable resistor, and wherein said variable resistor is formed by a parallel connection of p-channel and n-channel FETs to provide variable channel resistance depending on their gate voltage.

9. The tuning circuit of claim 8, wherein said converter means included in each of said pair of phase shifting circuits comprises a transistor for receiving an input AC signal at the gate or base thereof resistors having substantially equal resistance connected to the source and drain or the emitter and collector of said transistor, and a series circuit of said capacitor or said inductor and said resistor is connected between the source and grain or the emitter and collector of said transistor.

10. The tuning circuit of claim 8, wherein each of said feedback and input impedance elements is a resistor and the resistance ratio of said resistors is varied to adjust the tuning frequency bandwidth of said tuning amplifier section.

11. The tuning circuit of claim 8, wherein the dividing ratio of said voltage dividing circuit is set to 1.

12. The tuning circuit of claim 8, wherein the inductor in said combining means is formed on a semiconductor substrate and includes a pair of spiral electrodes magnetically coupled to each other by way of a magnetic member with a variable DC bias current made to flow one of said spiral electrodes for controlling the inductance of the other spiral electrode.

13. The tuning circuit of claim 8, wherein the capacitor in said combining means comprises a capacitance converter circuit including a negative gain amplifier and a capacitance element connected between the input and output of said amplifier.

14. The tuning circuit of claim 8, wherein the inductance in said combining means comprises an inductance converter circuit including an amplifier having a gain set between 0 and 1, and an inductance element connected between the input and output of said amplifier.

15. A tuning circuit including a plurality of cascade connected tuning amplifier sections of different tuning frequencies shifted from each other by predetermined amount, each of said tuning amplifier sections comprising:

an adding circuit for summing an input signal applied to one end of an input impedance element and a feedback signal applied to one end of a feedback impedance element;

a pair of phase shifting circuits of opposite directions of phase shift to each other, each including converter means for providing non-inverted and inverted AC signals of an input AC signal and combining means for combining one of said converted AC signals by way of a capacitor or an inductor and the other AC signal by way of a resistor;

a non-inverting circuit for amplifying an input AC signal by a predetermined amplification factor without changing the phase; and a voltage dividing circuit for dividing an input AC signal by a predetermined dividing ratio;

wherein said pair of phase shifting circuits, said non-inverting circuit and said voltage dividing circuit are connected in a cascade manner, the summed signal from said adding circuit is applied to the front stage circuit of said cascade connected circuits, the signal from the final stage circuit is applied to one end of said feedback impedance as the feedback signal, and the signal to be applied to said voltage dividing circuit is derived as the output signal, wherein the time constant of series circuit of said capacitor or inductor and said resistor constituting said combining means is varied to adjust the tuning characteristics, p1 wherein said resistor in said combining means is a variable resistor for adjusting the tuning characteristics in response to the resistance of said variable resistor, and wherein said variable resistor is formed by a parallel connection of p-channel and n-channel FETs to provide variable channel resistance depending on their gate voltage.

16. The tuning circuit of claim 15, wherein said converter means included in each of said pair of phase shifting circuits comprises a transistor for receiving an input AC signal at the gate or base thereof resistors having substantially equal resistance connected to the source and drain or the emitter and collector of said transistor, and a series circuit of said capacitor or said inductor and said resistor is connected between the source and grain or the emitter and collector of said transistor.

17. The tuning circuit of claim 15, wherein each of said feedback and input impedance elements is a resistor and the resistance ratio of said resistors is varied to adjust the tuning frequency bandwidth of said tuning amplifier section.

18. The tuning circuit of claim 15, wherein the dividing ratio of said voltage dividing circuit is set to 1.

19. The tuning circuit of claim 15, wherein the inductor in said combining means is formed on a semiconductor substrate and includes a pair of spiral electrodes magnetically coupled to each other by way of a magnetic member with a variable DC bias current made to flow one of said spiral electrodes for controlling the inductance of the other spiral electrode.

20. The tuning circuit of claim 15, wherein the capacitor in said combining means comprises a capacitance converter circuit including a negative gain amplifier and a capacitance element connected between the input and output of said amplifier.

21. The tuning circuit of claim 15, wherein the inductance in said combining means comprises an inductance converter circuit including an amplifier having a gain set between 0 and 1, and an inductance element connected between the input and output of said amplifier.

22. A tuning circuit comprising a plurality of cascade connected tuning amplifier sections of different tuning frequencies shifted from each other by predetermined amount, each of said tuning amplifier sections comprising:

an adding circuit for summing an input signal applied to one end of an input impedance element and a feedback signal applied to one end of a feedback impedance element;

a pair of phase shifting circuits of the same phase shift direction, each including converter means for converting an input AC signal into non-inverted and inverted AC output signals, and combining means for combining one of the converted AC output signals through a capacitor or an inductor and the other AC output signal through a resistor;

a phase inverting circuit for inverting the phase of the AC input signal and amplifying with a predetermined amplification factor; and a voltage dividing circuit for dividing the input AC signal by a predetermined dividing ratio;

wherein said pair of phase shifting circuits, said phase inverting circuit and said voltage dividing circuit are cascade connected with the summed signal from said adding circuit applied to the front stage of said cascade connected circuits, the output signal from the final stage applied to one end of said feedback impedance element as the feedback signal and the input signal to said voltage dividing circuit derived as the output signal, wherein the time constant of series circuit of said capacitor or inductor and said resistor constituting said combining means is varied to adjust the tuning characteristics, wherein said resistor in said combining means is a variable resistor for adjusting the tuning characteristics in response to the resistance of said variable resistor, and wherein said variable resistor is formed by a parallel connection of p-channel and n-channel FETs to provide variable channel resistance depending on their gate voltage.

23. The tuning circuit of claim 22, wherein said converter means included in each of said pair of phase shifting circuits comprises a transistor for receiving an input AC signal at the gate or base thereof resistors having substantially equal resistance connected to the source and drain or the emitter and collector of said transistor, and a series circuit of said capacitor or said inductor and said resistor is connected between the source and grain or the emitter and collector of said transistor.

24. The tuning circuit of claim 22, wherein each of said feedback and input impedance elements is a resistor and the resistance ratio of said resistors is varied to adjust the tuning frequency bandwidth of said tuning amplifier section.

25. The tuning circuit of claim 22, wherein the dividing ratio of said voltage dividing circuit is set to 1.

26. The tuning circuit of claim 22, wherein the inductor in said combining means is formed on a semiconductor substrate and includes a pair of spiral electrodes magnetically coupled to each other by way of a magnetic member with a variable DC bias current made to flow one of said spiral electrodes for controlling the inductance of the other spiral electrode.

27. The tuning circuit of claim 22, wherein the capacitor in said combining means comprises a capacitance converter circuit including a negative gain amplifier and a capacitance element connected between the input and output of said amplifier.

28. The tuning circuit of claim 22, wherein the inductance in said combining means comprises an inductance converter circuit including an amplifier having a gain set between 0 and 1, and an inductance element connected between the input and output of said amplifier.

29. The tuning circuit of either one of claims 1 through 29, wherein all constituent components are integrally formed on a semiconductor substrate.

* * * * *